(12) United States Patent
Sharma et al.

(10) Patent No.: US 12,471,334 B2
(45) Date of Patent: Nov. 11, 2025

(54) INTEGRATED CIRCUIT DEVICES WITH ANGLED TRANSISTORS FORMED BASED ON ANGLED WAFERS

(71) Applicant: Intel Corporation, Santa Clara, CA (US)

(72) Inventors: Abhishek A. Sharma, Hillsboro, OR (US); Tahir Ghani, Portland, OR (US); Anand S. Murthy, Portland, OR (US); Wilfred Gomes, Portland, OR (US); Sagar Suthram, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 623 days.

(21) Appl. No.: 17/677,239

(22) Filed: Feb. 22, 2022

(65) Prior Publication Data

US 2023/0268382 A1   Aug. 24, 2023

(51) Int. Cl.
*H10D 62/40* (2025.01)
*H10D 30/01* (2025.01)
*H10D 62/10* (2025.01)
*H10B 10/00* (2023.01)
*H10B 12/00* (2023.01)
*H10D 30/67* (2025.01)

(52) U.S. Cl.
CPC ......... *H10D 62/405* (2025.01); *H10D 30/014* (2025.01); *H10D 62/121* (2025.01); *H10B 10/12* (2023.02); *H10B 12/05* (2023.02); *H10B 12/30* (2023.02); *H10D 30/6735* (2025.01)

(58) Field of Classification Search
CPC ............... H10D 62/405; H10D 62/121; H10D 30/6735; H10D 84/85; H10D 84/08; H10D 84/0167; H10D 84/038; H10B 12/30; H10B 10/12; H10B 12/05; H01L 23/544; H01L 25/0655

See application file for complete search history.

(56) References Cited

U.S. PATENT DOCUMENTS

| 5,600,587 A | 2/1997 | Koike |
| 8,574,969 B2 | 11/2013 | Cohen et al. |

(Continued)

FOREIGN PATENT DOCUMENTS

| WO | 2018111215 A1 | 6/2018 |
| WO | 2018125024 A1 | 7/2018 |

*Primary Examiner* — Wasiul Haider
(74) *Attorney, Agent, or Firm* — Akona IP PC

(57) ABSTRACT

IC devices including angled transistors formed based on angled wafers are disclosed. An example IC device includes a substrate and a semiconductor structure. A crystal direction of a crystal structure in the semiconductor structure is not aligned with a corresponding crystal direction (e.g., having same Miller indices) of a crystal structure in the substrate. An angle between the two crystal directions may be 4-60 degrees. The semiconductor structure is formed based on another substrate (e.g., a wafer) that has a different orientation from the substrate, e.g., flats or notches of the two substrates are not aligned. The crystal direction of the semiconductor structure may be determined based on a crystal direction in the another substrate. The semiconductor structure may be a portion of a transistor, e.g., the channel region and S/D regions of the transistor. The semiconductor structure may be angled with respect to an edge of the substrate.

20 Claims, 16 Drawing Sheets

(56) References Cited

U.S. PATENT DOCUMENTS

| | | |
|---|---|---|
| 10,535,680 B2 | 1/2020 | Shen et al. |
| 2005/0199913 A1 | 9/2005 | Hofmann et al. |
| 2006/0268597 A1 | 11/2006 | Sakuma |
| 2008/0048226 A1 | 2/2008 | Heo et al. |
| 2008/0121956 A1 | 5/2008 | Kanaya |
| 2009/0236663 A1 | 9/2009 | Teo et al. |
| 2010/0321975 A1 | 12/2010 | Kimura et al. |
| 2011/0254013 A1 | 10/2011 | Xiao et al. |
| 2012/0040528 A1 | 2/2012 | Kim et al. |
| 2012/0314476 A1 | 12/2012 | Appenzeller et al. |
| 2016/0027490 A1 | 1/2016 | Müller |
| 2018/0182763 A1 | 6/2018 | Juengling |
| 2019/0006391 A1* | 1/2019 | Shen .................. H10D 30/6735 |
| 2020/0091162 A1 | 3/2020 | Morris et al. |

\* cited by examiner

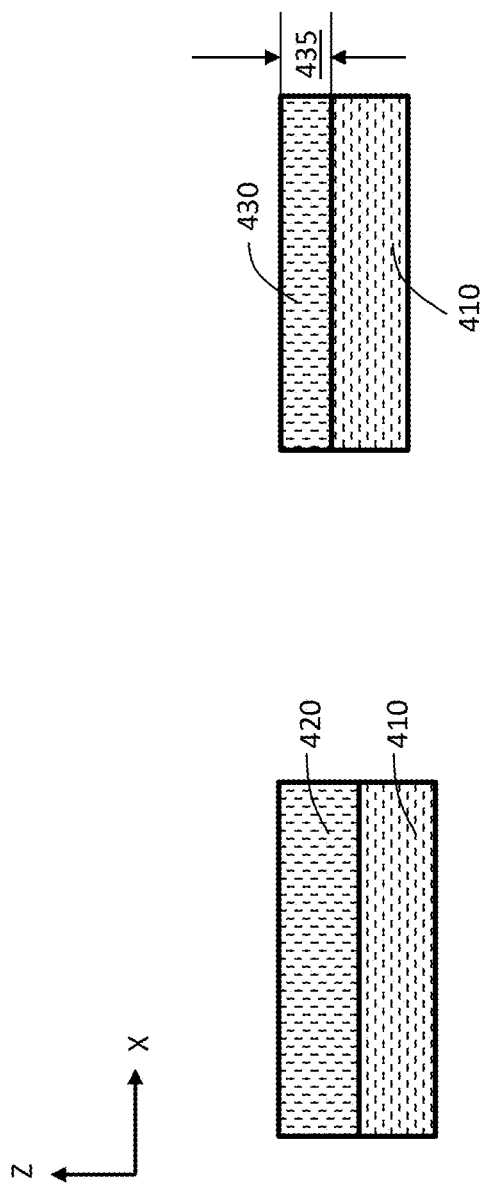

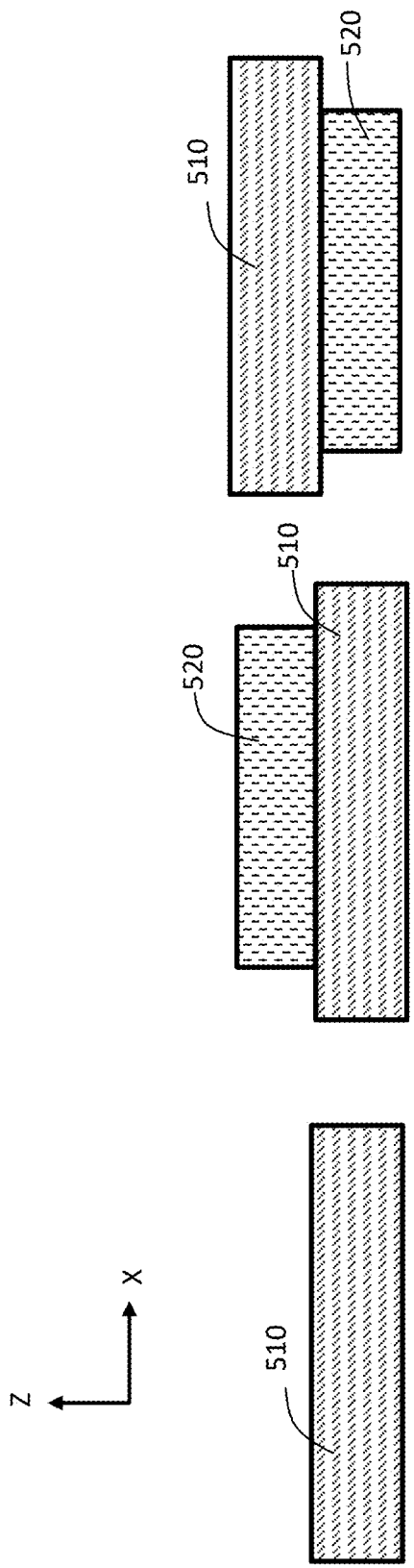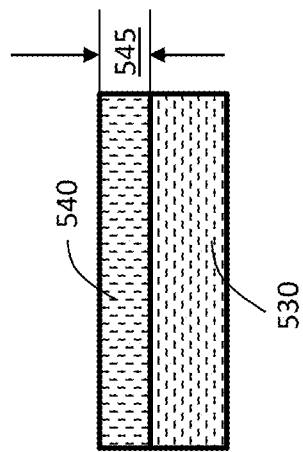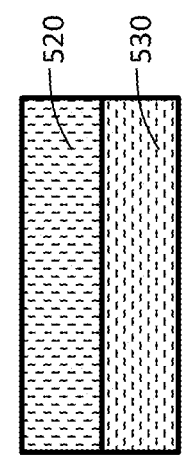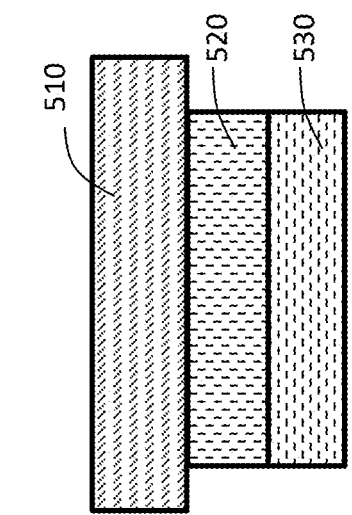

INTEGRATED CIRCUIT DEVICES WITH ANGLED TRANSISTORS FORMED BASED ON ANGLED WAFERS

TECHNICAL FIELD

This disclosure relates generally to the field of semiconductor devices, and more specifically, to integrated circuit (IC) devices.

BACKGROUND

Memory cells are fundamental building blocks of computer memory. A memory device is composed of memory cells. A memory cell may store one bit of binary information. The storage capacity of a memory device can depend on the number of memory cells in the memory device. Thus, improvement in memory cell density is important to achieve better performance of memory devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 4A-4B illustrate an example process of forming a pair of unaligned wafers, according to some embodiments of the disclosure.

FIGS. 5A-5F illustrate another example process of forming a pair of unaligned wafers, according to some embodiments of the disclosure.

DETAILED DESCRIPTION

Overview

Figure 1:
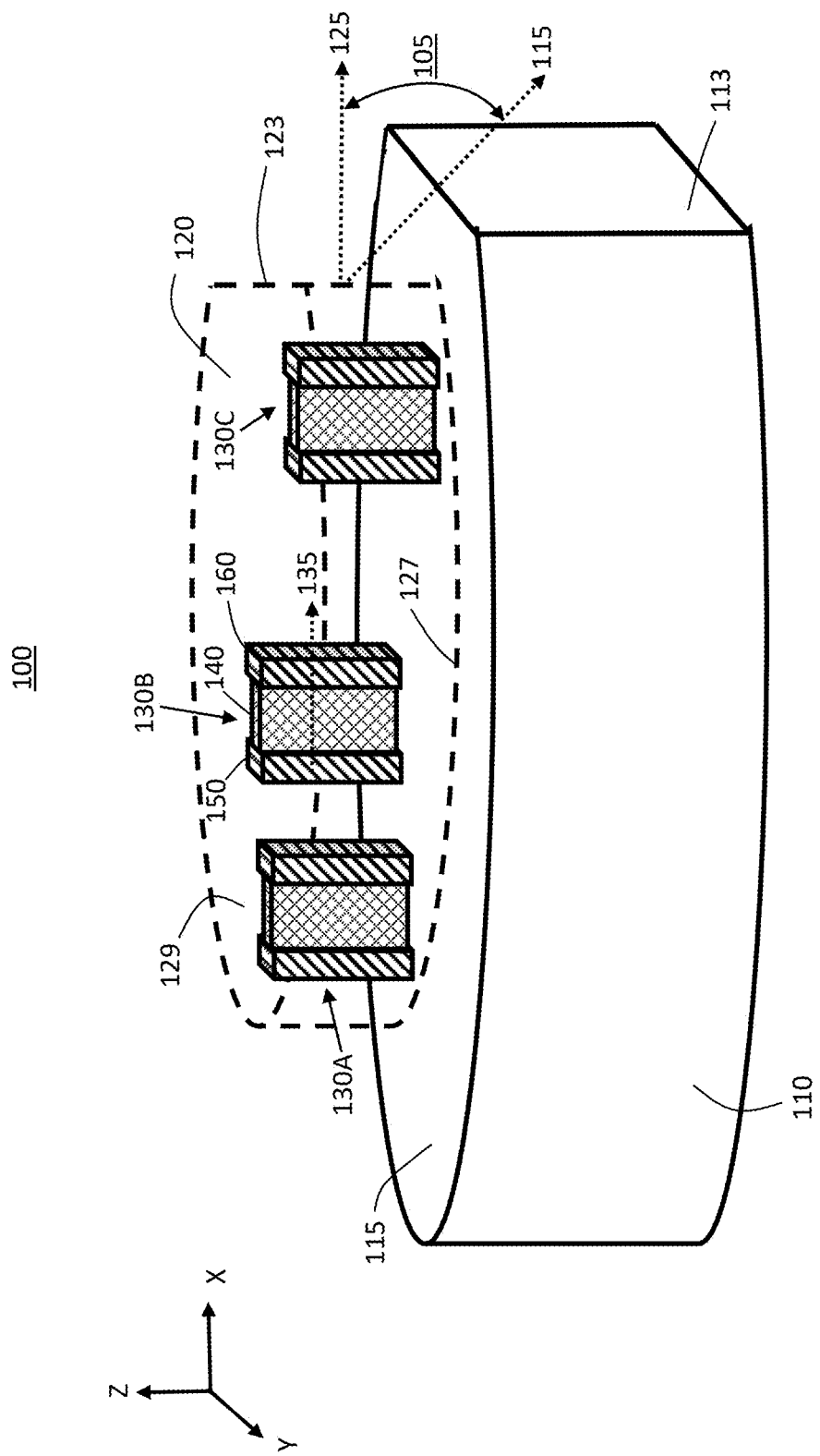
FIG. 1 is a perspective view of an example IC device including angled transistors, according to some embodiments of the disclosure.

The systems, methods, and devices of this disclosure each have several innovative aspects, no single one of which is solely responsible for all of the desirable attributes disclosed herein. Details of one or more implementations of the subject matter described in this specification are set forth in the description below and the accompanying drawings.

Embodiments of the present disclosure are applicable to different types of memory devices. Some embodiments of the present disclosure may refer to SRAM. Other embodiments of the present disclosure may refer to DRAM. However, embodiments of the present disclosure may be equally applicable to memory cells implemented other technologies. Thus, in general, memory cells/arrays described herein may be implemented as standalone SRAM devices, DRAM devices, or any other volatile or nonvolatile memory cells/arrays.

A memory device usually includes a plurality of memory cells. A memory cell includes a memory element, which stores information, and an access transistor, which is coupled to the memory element and controls access to the memory element. Memory cells have, conventionally, been implemented with access transistors being FEOL, logic-process based, transistors implemented in an upper-most layer of a semiconductor substrate.

One challenge common to memory cells resides in that, given a usable surface area of a substrate, there are only so many FEOL transistors that can be formed in that area, placing a significant limitation on the density of memory cells incorporating such transistors. In conventional solutions, attempts to increase memory density have included decreasing the critical dimensions of the memory cells, which requires ever-increasing process complexity and cost, resulting in diminishing returns and expected slow pace of memory scaling for future nodes.

One reason that the number of transistors in a memory device is limited is due to the alignment of the transistors with control lines (e.g., bitline (BL) or writeline (WL)) of the memory device. A longitudinal axis of a semiconductor structure (e.g., channel region or a combination of channel region and S/D regions) in a transistor is typically aligned with (i.e., parallel or perpendicular to) a longitudinal axis of a control line. As the dimension of the semiconductor structure along the longitudinal axis may be greater than dimensions in other directions. When the longitudinal axes of the semiconductor structure and control line are aligned, not many transistors can be arranged in the limited space in the memory device.

In contrast, more transistors can be placed into the memory device when the longitudinal axes of semiconductor structures in these transistors is not aligned with (i.e., not parallel or perpendicular, but angled) to longitudinal axes of control lines. However, with conventional technologies of fabricating transistors, such transistors can have compromised performance. A semiconductor structure of a transistor is usually formed based on a wafer and aligned with the wafer. Crystal structures in the semiconductor structure are often intended to be aligned with crystal structures in the wafer, e.g., the crystal directions (or lattice planes) of the semiconductor structure and the wafer are aligned. This can be important to avoid lattice mismatch. Lattice mismatch can usually cause weak boning, unintended distortion, or other types of compromised performances. Some conventional technologies allow lattice planes of crystal structures in transistors semiconductor structures to be aligned with face diagonal planes or body diagonal planes of crystal structures in the wafer. However, convention technologies typically fail to provide further flexibility with respect to orientations of semiconductor structures of transistors. Therefore, improved technologies for increasing density of transistors in memory devices and for fabricating such transistors are needed.

Embodiments of the present disclosure may improve on at least some of the challenges and issues described above by providing IC devices with angled transistors that are formed through a pair of unaligned wafers. An example angled transistor is a transistor including a semiconductor structure (e.g., a channel region) that is not aligned with a substrate of the IC device. The substrate may be a die, wafer, In some embodiments, a crystal direction of the channel region is not parallel or perpendicular to a crystal direction of the substrate. A crystal direction may be an orientation orthogonal to a lattice plane of a crystal structure. A lattice plane may be a plane whose intersections with the lattice are periodic, e.g., a plane of a surface of a unit crystal cell. The crystal direction of the channel region may have the same Miller indices as the crystal direction of the substrate. For instance, the two crystal directions are both [100], [010], [001], [110], [111], and so on. An angle between the two crystal directions may be 4 to 60 degrees.

The semiconductor structure of the angled transistor is formed based on an additional substrate that has a different orientation from the substrate, e.g., flats or notches of the two substrates are not aligned. For instance, the semiconductor structure may be formed in or over the additional substrate. The crystal direction of the semiconductor structure may be determined based on a crystal direction in the additional substrate. In some embodiments, the additional substrate is initially formed with a flat or notch that is aligned with a flat or notch of the substrate, then the additional substrate is rotated relative to the substrate, e.g., by an angle of 4 to 60 degrees. The semiconductor structure may be a portion of an accessing transistor of a memory device and have a longitudinal axis that is angled with respect to a longitudinal axis of a control line in the memory device. The number of such angled accessing transistors that can be placed in a memory device area is higher than the number of aligned transistors that can be placed in the same area. Thus, the transistor density can be increase.

Furthermore, even though the semiconductor structure is not aligned with the substrate, such misalignment does not cause the unwanted lattice mismatch. That is because the semiconductor structure is formed based on the additional substrate and crystal structures in the semiconductor structure can be aligned with crystal structure in the additional substrate. Additionally, angled transistors of the present disclosure can be either MOSFETs, TFETs, or both. Thus, the memory array may operate in both low-power and high-power applications. Therefore, by using a pair of unaligned substrates, the present disclosure provides improved technologies for increasing transistor density in memory devices without compromising performance of transistors.

In the following, some descriptions may refer to a particular S/D region or contact being either a source region/contact or a drain region/contact. However, unless specified otherwise, which region/contact of a transistor is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed.

As used herein, the term "metal layer" may refer to a layer above a substrate that includes electrically conductive interconnect structures for providing electrical connectivity between different IC components. Metal layers described herein may also be referred to as "interconnect layers" to clearly indicate that these layers include electrically conductive interconnect structures which may but does not have to be metal.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art. Also, the term "or" refers to an inclusive "or" and not to an exclusive "or."

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 11A-11B, such a collection may be referred to herein without the letters, e.g., as "FIG. 11."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with stacked memory devices as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Angled Transistor

FIG. 1 is a perspective view of an example IC device 100 including angled transistors 130A-C (collectively referred to as "angled transistors 130" or "angled transistor 130"), according to some embodiments of the disclosure. The IC device 100 also includes substrates 110 and 120. In other embodiments, the IC device 100 may include more, fewer, or different components. For example, the IC device 100 may include a different number of substrates or angled transistors. As another example, the IC device 100 may include insulator layers, such as oxide layers. FIG. 1 also illustrates a coordinate system that includes an X-axis, a Y-axis, and a Z-axis that are orthogonal to each other.

The substrates 110 and 120 are a pair of unaligned substrates. The substrate 120 is angled with respect to the substrate 110. The substrate 110 is formed with an orientation indicator 113, and the substrate 120 is formed with an orientation indicator 123. The orientation indicators 113 and 123 provide visual reference of orientations of the substrates 110 and 120. An orientation indicator may be a flat or a notch formed in a substrate. In the embodiment of FIG. 1, each orientation indicator is a flat surface formed in the corresponding substrate, and an orientation of a substrate is parallel or perpendicular to the flat surface. As shown in FIG. 1, the substrate 110 has an orientation 115 that is orthogonal to the orientation indicator 113, and the substrate 120 has an orientation 125 that is orthogonal to the orientation indicator 123. In other embodiments, an orientation indicator may have a different shape. For instance, an orientation indicator may have a curved shape (e.g., a V shape) in an X-Y plane.

An orientation indicator may be determined based on crystal structures in a substrate. In an example where a substrate has cubic crystal structures and a unit cubic crystal structure has three axes perpendicular to each other, the orientation indicator (e.g., the flat surface of the orientation indicator) may refer to a lattice plane in a unit crystal structure, e.g., a plane having Miller indices of (100), (010), or (001). Such plane may be on or parallel to a surface of the cubic crystal structure. Alternative, the orientation indicator may refer to a face diagonal plane in a unit crystal structure (e.g., (110), (011), or (101)) or a body diagonal plane in a unit crystal structure (e.g., (111)). The substrate can be oriented based on the orientation indicator in a semiconductor fabrication process to form semiconductor structures with crystal directions aligned with the orientation indicator. For instance, with an orientation indicator refers to the (100) plane, the semiconductor structures can be formed on the (100) plane, versus with an orientation indicator refers to the (110) plane, the semiconductor structures can be formed on the (110) plane. Such a plane is a diagonal plane in the cubic crystal structure.

In some embodiments (e.g., embodiments where a semiconductor structure having similar cubic crystal structures as the substrate), orientation indicators referring to a (100), (010), or (001) plane may be preferred to get stronger bonding between the substrate and the semiconductor structure. Alternatively, orientation indicators referring to a face diagonal plane may be preferred to get more atoms or molecules.

As shown in FIG. 1, the orientation 125 is not aligned with (i.e., not parallel or perpendicular to) the orientation 115, i.e., the orientation 125 is angled with respect to the orientation 115. An angle 105 between the orientation 115 and the orientation 125 may be in a range from 4 to 60 degrees. In some embodiments, the pair of unaligned substrates may be formed by rotating the substrate 120 with respect to the substrate 110 by 4 to 60 degrees. For instance, the substrates 110 and 120 are initially formed with aligned orientations. Then one of the substrates 110 and 120 is rotated relative to the other one, resulting in the misalignment of the orientations. The substrates 110 and 120 may be bonded together after the rotation so that the angle between the orientations 115 and 125 of the substrates 110 and 120 can be kept. More details regarding unaligned substrates are described below in conjunction with FIGS. 2A-2C and FIGS. 3A-3C.

As shown in FIG. 1, the substrate 110 is over the substrate 120. In the embodiment of FIG. 1, the substrate 120 is on the substrate 110, with a surface 127 of the substrate 120 contacting the surface 117 of the substrate 110. In the embodiment of FIG. 1, the substrate 110 has a larger cross-section in the X-Y plane than the cross-section of the substrate 120 in the X-Y plane. In other embodiments, the substrates 110 and 120 may have cross-sections of the same or substantially same size. Also, the substrates 110 and 120 may have different heights along the Z-axis. The substrates 110 and 120 may have different materials.

A substrate (e.g., the substrate 110 or 120) may be any suitable structure with which the angled transistors 130 can be associated. The substrate may be a support structure, a die, a wafer, or a chip. In some embodiments, the substrate may be a printed circuit board (PCB) substrate. In other embodiments, the substrate is a semiconductor substrate, which is composed of semiconductor material systems including, for example, n-type or p-type materials systems. One or more transistors may be built on the substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of Group III-V, Group II-VI, or Group IV materials. In some embodiments, the substrate may be non-crystalline. Although a few examples of materials from which the substrate may be formed are described here, any material that may serve as a foundation upon which IC devices implementing angled transistors as described herein may be built falls within the spirit and scope of the present disclosure. In various embodiments, the substrate may include any such substrate material that provides a suitable surface for forming the fill pattern. The substrate may, e.g., be the wafer 2000 of FIG. 11A, discussed below, and may be, or be included in, a die, e.g., the singulated die 2002 of FIG. 11B, discussed below.

The angled transistors 130 may be field-effect transistors (FETs), such as MOSFETs, TFETs, or a combination of both. An angled transistor 130 includes a semiconductor structure that includes a channel region 140, a source region 150, and a drain region 160. The semiconductor structures of the angled transistors 130 are in the substrate 120 and over the substrate 110. Each semiconductor structure extends from the surface 127 to another surface 129 of the substrate 120. The surface 129 is opposite the surface 127.

In some embodiments, the semiconductor structures are formed based on the substrate 120, e.g., at least partially in the substrate 120 or over the substrate 120. As the semiconductor structures are formed based on the substrate 120, the semiconductor structures follow the orientation 125 of the substrate 120. For instance, a semiconductor structure has an orientation aligned with (parallel or perpendicular to) the orientation 125. As shown in FIG. 1, a semiconductor structure has an orientation 135 aligned with the orientation 125. The orientation 135 is along a direction from the source region 150 to the drain region 160. In other embodiments, the orientation 135 may be along a direction from the drain region 160 to the source region 150. The channel region 140 (or the semiconductor structure) may have a longitudinal axis along the orientation 135. The orientation 135 may be aligned with a crystal direction of crystal structures in the semiconductor structure, such as crystal structures in the channel region 140. As the orientation 115 of the substrate 110 is angled with the orientation 135, the orientation 135 is angled with respect to the orientation 115. The angle between the orientation 135 and the orientation 115 may be in a range from 4 to 60 degrees. In some embodiments, the crystal direction of the semiconductor structure is angled with respect to the crystal direction of the substrate 110. The angle between the two crystal directions may be in a range from 4 to 60 degrees. The two crystal directions may have the same Miller indices.

The substrate 120 may include a semiconductor material, from which at least a portion of a semiconductor structure is formed. The channel region 140 or the whole semiconductor structure may be a planar structure or a non-planar structure. A non-planar structure is a three-dimensional structure, such as fin, nanowire, or nanoribbon. A non-planar structure may has a longitudinal axis and a transvers cross-section perpendicular to the longitudinal axis. The longitudinal axis may be aligned with the orientation 135. In some embodiments, a dimension of the non-planar structure along the longitudinal axis may be greater than dimensions along other directions, e.g., directions along axes perpendicular to the longitudinal axis.

The channel region 140 includes a channel material. The channel material may be composed of semiconductor material systems including, for example, n-type or p-type materials systems. In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a compound semiconductor with a first sub-lattice of at least one element from Group III of the periodic table (e.g., Al, Ga, In), and a second sub-lattice of at least one element of group V of the periodic table (e.g., P, As, Sb). In some embodiments, the channel material may include a compound semiconductor with a first sub-lattice of at least one element from Group II of the periodic table (e.g., Zn, Cd, Hg), and a second sub-lattice of at least one element of Group IV of the periodic table (e.g., C, Si, Ge, Sn, Pb). In some embodiments, the channel material is an epitaxial semiconductor material deposited using an epitaxial deposition process. The epitaxial semiconductor material may have a polycrystalline structure with a grain size between about 2 nanometers and 100 nanometers, including all values and ranges therein.

For some example n-type transistor embodiments (i.e., for the embodiments where an angled transistor 130 is an NMOS transistor or an n-type TFET), the channel material may advantageously include a III-V material having a high electron mobility, such as, but not limited to InGaAs, InP, InSb, and InAs. For some such embodiments, the channel material may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel material may be an intrinsic III-V material, i.e., a III-V semiconductor material not intentionally doped with any electrically active impurity. In alternate embodiments, a nominal impurity dopant level may be present within the channel material, for example to further fine-tune a threshold voltage Vt, or to provide HALO pocket implants, etc. Even for impurity-doped embodiments however, impurity dopant level within the channel material 304 may be relatively low, for example below $10^{15}$ dopant atoms per cubic centimeter ($cm^{-3}$), and advantageously below $10^{13}$ $cm^{-3}$. These materials may be amorphous or polycrystalline, e.g., having a crystal grain size between 0.5 nanometers and 100 nanometers.

For some example p-type transistor embodiments (i.e., for the embodiments where an angled transistor 130 is a PMOS transistor or a p-type TFET), the channel material may advantageously be a Group IV material having a high hole mobility, such as, but not limited to Ge or a Ge-rich SiGe alloy. For some example embodiments, the channel material may have a Ge content between 0.6 and 0.9, and advantageously may be at least 0.7. In some embodiments with highest mobility, the channel material may be intrinsic III-V (or IV for P-type devices) material and not intentionally doped with any electrically active impurity. In alternate embodiments, one or more a nominal impurity dopant level may be present within the channel material, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. These materials may be amorphous or polycrystalline, e.g., having a crystal grain size between 0.5 nanometers and 100 nanometers.

In some embodiments, the channel material may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, aluminum zinc oxide, or tungsten oxide. In general, for a thin-film transistor (TFT), the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, molybdenum disulfide, N- or P-type amorphous or polycrystalline silicon, monocrystalline silicon, germanium, indium arsenide, indium gallium arsenide, indium selenide, indium antimonide, zinc antimonide, antimony selenide, silicon germanium, gallium nitride, aluminum gallium nitride, indium phosphide, black phosphorus, zinc sulfide, indium sulfide, gallium sulfide, each of which may possibly be doped with one or more of gallium, indium, aluminum, fluorine, boron, phosphorus, arsenic, nitrogen, tantalum, tungsten, and magnesium, etc. In some embodiments, a thin-film channel material may be deposited at relatively low temperatures, which allows depositing the channel material within the thermal budgets imposed on back-end fabrication to avoid damaging other components, e.g., front end components such as logic devices.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors.

IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3$ $(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

The source region 150 and the drain region 160 are connected to the channel region 140. The source region 150 and the drain region 160 each includes a semiconductor material with dopants. In some embodiments, the source region 150 and the drain region 160 have the same semiconductor material, which may be the same as the channel material of the channel region 140. A semiconductor material of the source region 150 or the drain region 160 may be a Group IV material, a compound of Group IV materials, a Group III/V material, a compound of Group III/V materials, a Group II/VI material, a compound of Group II/VI materials, or other semiconductor materials. Example Group II materials include zinc (Zn), cadmium (Cd), and so on. Example Group III materials include aluminum (Al), boron (B), indium (In), gallium (Ga), and so on. Example Group IV materials include silicon (Si), germanium (Ge), carbon (C), etc. Example Group V materials include nitrogen (N), phosphorus (P), arsenic (As), antimony (Sb), and so on. Example Group VI materials include sulfur(S), selenium (Se), tellurium (Te), oxygen (O), and so on. A compound of Group IV materials can be a binary compound, such as SiC, SiGe, and so on. A compound of Group III/V materials can be a binary, tertiary, or quaternary compound, such as GaN, InN, and so on. A compound of Group II/VI materials can be a binary, tertiary, or quaternary compounds, such as CdSe, CdS, CdTe, ZnO, ZnSe, ZnS, ZnTe, CdZnTe, CZT, HgCdTe, HgZnTe, and so on.

In some embodiments, the dopants in the source region 150 and the drain region 160 are the same type. In other embodiments, the dopants of the source region 150 and the drain region 160 may be different (e.g., opposite) types. In an example, the source region 150 has n-type dopants and the drain region 160 has p-type dopants. In another example, the source region 150 has p-type dopants and the drain region 160 has n-type dopants. Example n-type dopants include Te, S, As, tin (Sn), Si, Ga, Se, S, In, Al, Cd, chlorine (CI), iodine (I), fluorine (F), and so on. Example p-type dopants include beryllium (Be), Zn, magnesium (Mg), Sn, P, Te, lithium (Li), sodium (Na), Ga, Cd, and so on.

In some embodiments, the source region 150 and the drain region 160 may be highly doped, e.g., with dopant concentrations of about $1 \cdot 10^{21}$ cm$^{-3}$, in order to advantageously form Ohmic contacts with the respective S/D contacts (also sometimes interchangeably referred to as "S/D electrodes"), although these regions may also have lower dopant concentrations and may form Schottky contacts in some implementations. Irrespective of the exact doping levels, the source region 150 and the drain region 160 may be the regions having dopant concentration higher than in other regions, e.g., higher than a dopant concentration in the channel region 140, and, therefore, may be referred to as "highly doped" (HD) regions. The channel region 140 may include one or more semiconductor materials with doping concentrations significantly smaller than those of the source region 150 and the drain region 160. For example, in some embodiments, the channel material of the channel region 140 may be an intrinsic (e.g., undoped) semiconductor material or alloy, not intentionally doped with any electrically active impurity. In alternate embodiments, nominal impurity dopant levels may be present within the channel material, for example to set a threshold voltage Vt, or to provide HALO pocket implants, etc. In such impurity-doped embodiments however, impurity dopant level within the channel material is still significantly lower than the dopant level in the source region 150 and the drain region 160, for example below $10^{15}$ cm$^{-3}$, or below $10^{13}$ cm$^{-3}$. Depending on the context, the term "S/D terminal" may refer to a S/D region or a S/D contact or electrode of a transistor.

An angled transistor 130 also includes a gate (not shown in FIG. 1) that is over or wraps around at least a portion of the channel region 140. The gate may include a gate electrode and a gate insulator. The gate electrode can be coupled to a gate terminal that controls gate voltages applied on the angled transistor 130. The gate electrode may include one or more gate electrode materials, where the choice of the gate electrode materials may depend on whether the angled transistor 130 is a p-type transistor or an n-type transistor. For a p-type transistor, gate electrode materials that may be used in different portions of the gate electrode may include, but are not limited to, ruthenium, palladium, platinum, cobalt, nickel, and conductive metal oxides (e.g., ruthenium oxide). For an n-type transistor, gate electrode materials that may be used in different portions of the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode may include a stack of a plurality of gate electrode materials, where zero or more materials of the stack are workfunction (WF) materials and at least one material of the stack is a fill metal layer. Further materials/layers may be included next to the gate electrode for other purposes, such as to act as a diffusion barrier layer or/and an adhesion layer.

The gate insulator separates at least a portion of the channel region 140 from the gate electrode so that the channel region 140 is insulated from the gate electrode. In some embodiments, the gate insulator may wrap around at least a portion of the channel region 140. The gate insulator may also wrap around at least a portion of the source region 150 or the drain region 160. At least a portion of the gate insulator may be wrapped around by the gate electrode. The gate insulator includes an electrical insulator, such as a dielectric material, hysteretic material, and so on. Example dielectric material includes oxide (e.g., Si based oxides, metal oxides, etc), high-k dielectric, and so on. Example hysteretic material include ferroelectric materials, antiferroelectric materials, etc.

In some embodiments, an angled transistor 130 may be a TFT. A TFT is a special kind of a FET made by depositing a thin film of an active semiconductor material, as well as a dielectric layer and conductive (e.g., metallic) contacts, over a supporting layer that may be a non-conductor layer and a non-semiconductor layer. At least a portion of the active semiconductor material forms a channel region/material of the TFT. This is different from conventional, non-TFT, FEOL transistors where the semiconductor channel material of a transistor is typically a part of a semiconductor substrate, e.g., a part of a silicon wafer, or is epitaxially grown on a semiconductor substrate. Using TFTs as transistors of memory cells provides several advantages and enables unique architectures that were not possible with conventional, FEOL logic transistors. For example, advantages include substantially lower leakage in TFTs than in logic transistors and lower temperature processing used to fabricate TFTs. In context of the present disclosure, the angled transistor 130 being a TFT advantageously allows depositing a thin-film channel material of the angled transistor 130 in a non-planar arrangement to realize vertical transistor architecture, as will be described in greater detail below.

In the embodiment of FIG. 1, the angled transistors 130 have the same orientation 135. In other embodiments, the IC device 100 may include angled transistors have different orientations with respect to the substrate 110. In an example, a new substrate may be formed over the substrate 120 (i.e., the substrate 120 would be between the new substrate and the substrate 110). There may be a dielectric layer (e.g., an oxide layer) between the substrate 120 and the new substrate. One or more new angled transistors can be formed in the new substrate and have orientations aligned with the orientation of the new substrate. When the new substrate has a different orientation from the substrate 120, the new angled transistors would have a different orientation from the angled transistors 130. In another example, the substrate 120 can be removed and replaced with a replacement substrate. The replacement substrate may have a different orientation from the substrate 120 so that angled transistors formed in the replacement substrate would have a different orientation from the angled transistors 130.

Example Processes of Forming Angled Transistors

Figure 2C:
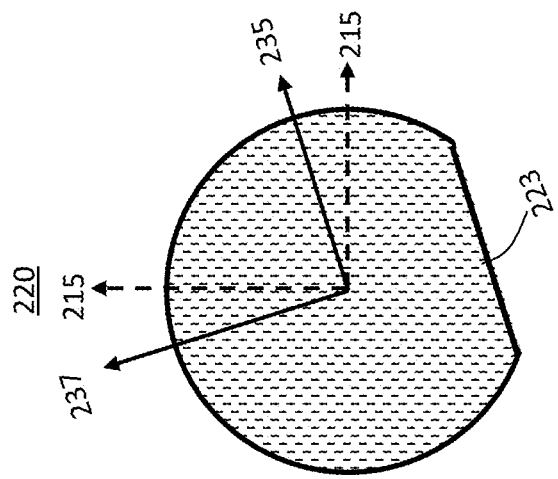
FIGS. 2A-2C illustrate an example pair of unaligned wafers, according to some embodiments of the disclosure.
Figure 2B:
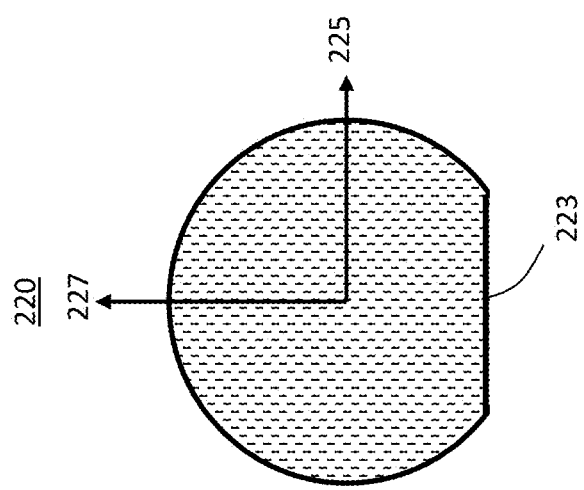
Figure 2A:
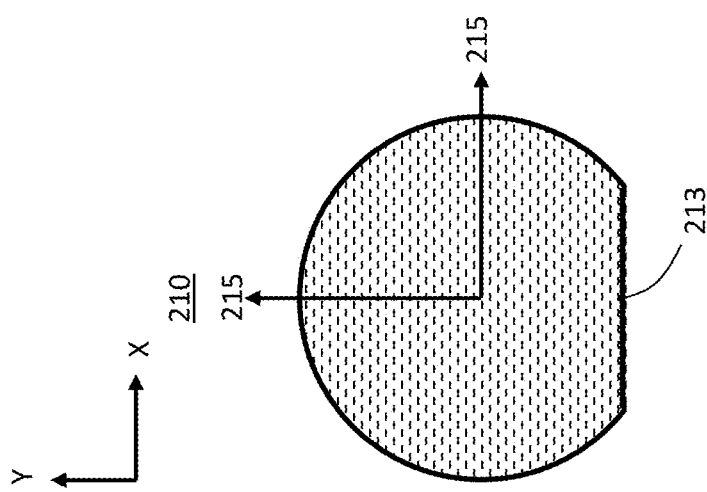

FIGS. 2A-2C illustrate an example pair of unaligned wafers 210 and 220, according to some embodiments of the disclosure. FIG. 2A shows a cross-section view of a wafer 210 in a X-Y plane. The wafer 210 has a flat 213 that can provide a visual reference to the orientation of the wafer 210. The flat 213 is a straight line in the X-Y plane. The flat 213 may have other shapes in other embodiments. In some embodiments, the wafer 210 may have multiple flats, the flat 213 may be the primary flat, e.g., the longest flat. FIG. 2A illustrates two orientations 215 and 217 of the wafer 210. The orientation 215 is in parallel to the flat 213. The orientation 217 is orthogonal to the flat 213. The wafer 210 may be an embodiment of the substrate 110 in FIG. 1.

FIG. 2B shows a cross-section view of another wafer 220. In some embodiments, the wafer 220 has the same size or material as the wafer 210. In other embodiments, the wafer 220 has a different size or material from the wafer 210. For example, the wafer 220 may have a smaller cross-section in the X-Y plane than the wafer 210 or a shorter thickness in a Z-axis, which is perpendicular to the X-Y plane, than the wafer 220. The wafer 220 has a flat 223 that can provide a visual reference to the orientation of the wafer 220. FIG. 2B illustrates two orientations 225 and 227 of the wafer 220. The orientation 225 is in parallel to the flat 223. The orientation 227 is orthogonal to the flat 223. The wafer 220 may be an embodiment of the substrate 120 in FIG. 1. As shown in FIG. 2B, the orientation 225 is aligned with the orientation 215, and the orientation 227 is aligned with the orientation 217. Thus, the wafers 210 and 220 have aligned orientations.

In FIG. 2C, the wafer 220 is rotated. Accordingly, the flat 223 is rotated. The wafer 220 has new orientations 235 and 237, which are not aligned with the orientations 215 and 217 of the wafer 210 anymore. The angle between the orientations 235 and 215 and the angle between the orientations 237 and 217 can be in a range from 4 to 60 degrees. In the embodiment of FIG. 2C, the wafer 220 is rotated. In other embodiments, the wafer 210 may be rotated instead.

Figure 3C:
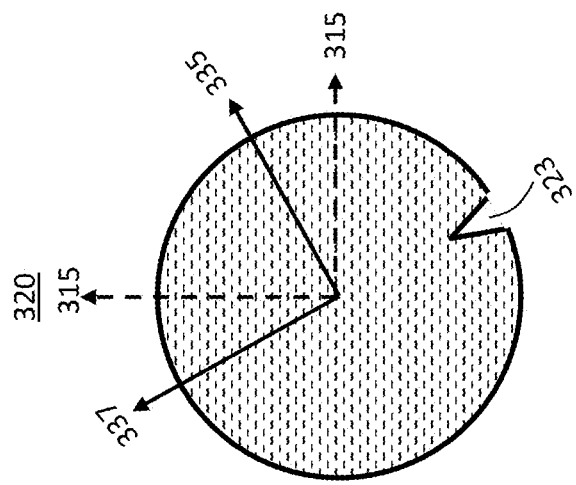
FIGS. 3A-3C illustrate another example pair of unaligned wafers, according to some embodiments of the disclosure.
Figure 3B:
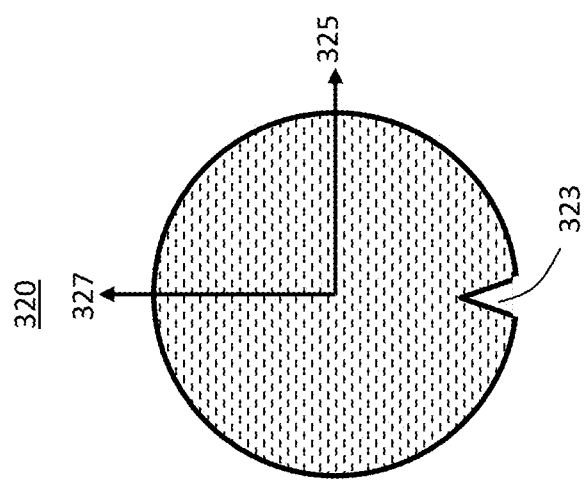
Figure 3A:
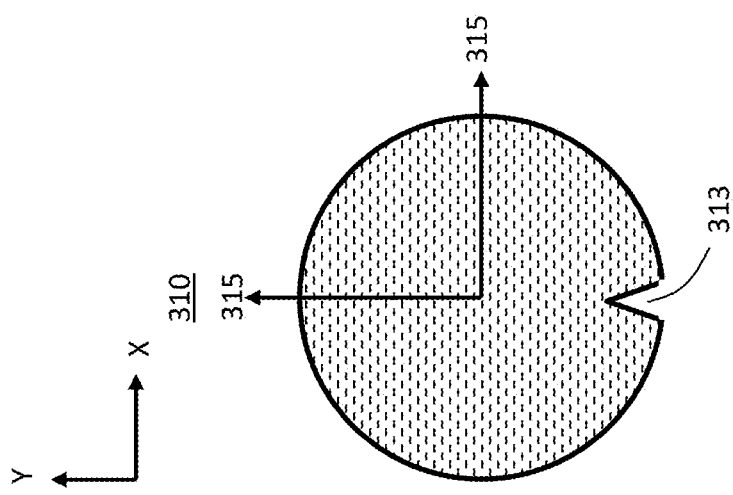

FIGS. 3A-3E illustrate another example pair of unaligned wafers 310 and 320, according to some embodiments of the disclosure. FIG. 3A shows a cross-section view of a wafer 310 in a X-Y plane. The wafer 310 has a notch 313 that can provide a visual reference to the orientation of the wafer 310. The notch 313 has a V shape in the X-Y plane. In other embodiments, the notch 313 may have other shapes. FIG. 3A illustrates two orientations 315 and 317 of the wafer 310. The orientation 315 is in parallel to the notch 313. The orientation 317 is orthogonal to the notch 313. The wafer 310 may be an embodiment of the substrate 110 in FIG. 1.

FIG. 3B shows a cross-section view of another wafer 320. In some embodiments, the wafer 320 has the same size or material as the wafer 310. In other embodiments, the wafer 320 has a different size or material from the wafer 310. For example, the wafer 320 may have a smaller cross-section in the X-Y plane than the wafer 310 or a shorter thickness in a Z-axis, which is perpendicular to the X-Y plane, than the wafer 320. The wafer 320 has a notch 323 that can provide a visual reference to the orientation of the wafer 320. FIG. 3B illustrates two orientations 325 and 327 of the wafer 320. The orientation 325 is in parallel to the notch 323. The orientation 327 is orthogonal to the notch 323. The wafer 320 may be an embodiment of the substrate 120 in FIG. 1. As shown in FIG. 3B, the orientation 325 is aligned with the orientation 315, and the orientation 327 is aligned with the orientation 317. Thus, the wafers 310 and 320 have aligned orientations.

In FIG. 3C, the wafer 320 is rotated. Accordingly, the notch 323 is rotated. The wafer 320 has new orientations 335 and 337, which are not aligned with the orientations 315 and 317 of the wafer 310 anymore. The angle between the orientations 335 and 315 and the angle between the orientations 337 and 317 can be in a range from 4 to 60 degrees. In the embodiment of FIG. 3C, the wafer 320 is rotated. In other embodiments, the wafer 310 may be rotated instead.

FIGS. 4A and 4B illustrate an example process of forming a pair of unaligned wafers 410 and 420, according to some embodiments of the disclosure. The wafers 410 and 420 have unaligned orientations, which may be a result of rotating one of the wafers 410 and 420. The rotation may be the same or similar to the rotation illustrated in FIGS. 2C and 3C. The pair of unaligned wafers 410 and 420 may be an embodiment of the a pair of unaligned wafers 210 and 220 or the pair of unaligned wafers 310 and 320.

In FIG. 4A, the wafers 410 and 420 are bonded together with the wafer 420 being angled with respect to the wafer 410. In some embodiments, the wafers 410 and 420 are bonded together through a thermal compression process. For instance, the wafers 410 and 420 are compressed at a predetermined temperature for a predetermined duration of time to form a bonding between the wafers 410 and 420. The temperature and duration of time can be determined based on the materials of the wafers 410 and 420. In some embodiments, an adhesive layer (not shown in FIG. 4D) is used to facilitate the bonding. The adhesive layer may be formed on one of the wafers 410 and 420, e.g., through spin coating. The adhesive layer may be in a flowable state. The heating during the thermal compression can harden the adhesive layer and form a stable bond between the wafers 410 and 420. An example of the adhesive layer is a hydrogen silsesquioxane (HSQ) layer.

In FIG. 4B, the wafer 420 is thinned to form a wafer 430. The wafer 430 may be an embodiment of the substrate 120 in FIG. 1. The wafer 430 has a predetermined thickness 435 along the Z-axis. In some embodiments, the predetermined thickness 435 is determined based on a target thickness of a channel region or a S/D region to be formed in the wafer 430. The predetermined thickness 435 may be equal to the target thickness of the channel region or S/D region. The wafer 420 may be thinned through etching or mechanical thinning techniques. The wafer 430 may be thinner than the wafer 410.

FIGS. 5A-5F illustrates another example process of forming a pair of unaligned wafers 530 and 540 through layer transfer, according to some embodiments of the disclosure. Layer transfer includes transferring a layer (e.g., a layer of a semiconductor material) from a growth substrate (e.g., a substrate on which the layer is deposited) to a target substrate. The wafer 530 may be an embodiment of the substrate 110 in FIG. 1. The wafer 540 may be an embodiment of the substrate 120 in FIG. 1.

FIG. 5A shows a growth substrate 510. The growth substrate 510 may be any suitable structure on which a wafer can be grown. The growth substrate 510 may be semiconductor substrate that includes a semiconductor material. Alternatively, the growth substrate 510 may include other materials, such as glass. In various embodiments, the growth substrate 510 may include any such substrate material that provides a suitable surface for forming a wafer.

In FIG. 5B, a wafer 520 is formed on the growth substrate 510, which generates a combined structure. The wafer 520 includes a semiconductor material. The wafer 520 may be formed by depositing the semiconductor material onto the growth substrate 510. Various deposition techniques can be used, including, e.g., atomic layer deposition (ALD), chemical vapor deposition (CVD), physical vapor deposition (PVD), etc. In FIG. 5C, the combined structure is flipped over so that the wafer 520 is on the bottom and the growth substrate 510 is on the top. The step in FIG. 5C may be optional.

In FIG. 5D, the combined structure is bonded to another wafer 530 with the wafer 520 touching the wafer 530. The wafer 530 may be an embodiment of the substrate 110 in FIGS. 1A and 1B. In some embodiments, the structure 515 and the wafer 520 are bonded together through a thermal compression process. For instance, the structure 515 is placed over the wafer 520 with the wafer 520 contacting the wafer 520 to form a structure 525. Then the structure 525 is compressed at a predetermined temperature for a predetermined duration of time to form a bonding between the wafer 520 and the wafer 530. The temperature and duration of time can be determined based on the materials of the wafers 520 and 530. In some embodiments, an adhesive layer (not shown in FIG. 5D) is used to facilitate the bonding. The adhesive layer may be formed on the wafer 520 or the wafer 530, e.g., through spin coating. The adhesive layer may be in a flowable state. The heating during the thermal compression can harden the adhesive layer and form a stable bond between the wafer 520 and the wafer 530. An example of the adhesive layer is a HSQ layer.

The wafer 520 is angled from the wafer 530. For instance, there is an angle of 4 to 60 degrees between an orientation of the wafer 520 and an orientation of the wafer 530. In some embodiments, the combination structure is rotated before the bonding process to make the wafer 520 angled from the wafer 530.

After the bonding process, the growth substrate 510 is removed from the structure 525. The growth substrate 510 can be removed through various techniques, such as etching, mechanical thinning, epitaxial lift-off, mechanical spalling, laser lift-off, ion cutting, and so on. Through the steps in FIGS. 5B-5E, the wafer 520 is "transferred" from the growth substrate 510 to the wafer 530, i.e., the target substrate of the layer transfer process.

In FIG. 5F, the wafer 520 is thinned to form a wafer 540. The wafer 540 may be an embodiment of the substrate 120 in FIG. 1. The wafer 540 has a predetermined thickness 545 along the Z-axis. In some embodiments, the predetermined thickness 545 is determined based on a target thickness of a channel region or a S/D region to be formed in the wafer 540. The predetermined thickness 545 may be equal to the target thickness of the channel region or S/D region. The wafer 520 may be thinned through etching or mechanical thinning techniques. The wafer 540 may be thinner than the wafer 530.

Figure 6B:
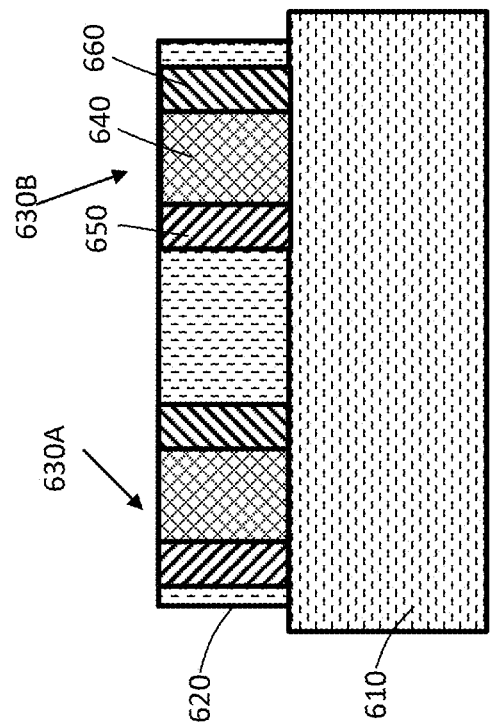
FIGS. 6A-6D illustrate formation of angle semiconductor structures using a pair of unaligned wafers, according to some embodiments of the disclosure.
Figure 6A:
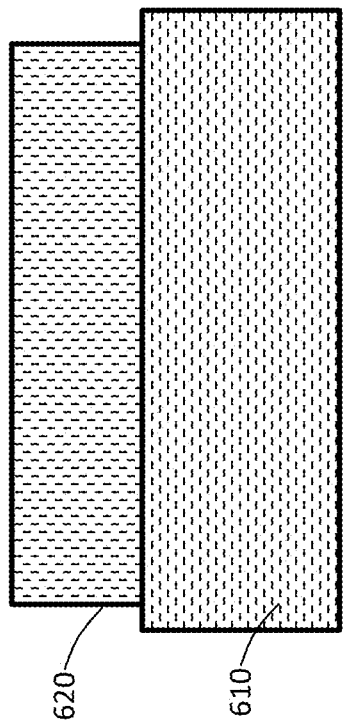

FIGS. 6A-6D illustrate angle semiconductor structures formed using a pair of unaligned wafers, according to some embodiments of the disclosure. FIG. 6A shows a pair of unaligned wafers 610 and 620. The pair of unaligned wafers 610 and 620 may be an embodiment of the pair of unaligned wafers 410 and 430 or the pair of unaligned wafers 530 and 540. In the embodiment of FIG. 6A, the wafer 620 has a shorter length along the X-axis than the wafer 610. Also, the wafer 620 may have a smaller thickness along the Z-axis than the wafer 610. The thickness of the wafer 620 may be predetermined, e.g., based on a desired thickness of semiconductor structures of angled transistors to be formed in the wafer 620. In other embodiments, the wafers 610 and 620 may have a same or substantially same dimension along the X-axis or Z-axis.

In FIG. 6B, semiconductor structures 630A and 630B (collectively referred to as "semiconductor structures 630" or "semiconductor structure 630") are formed in the wafer 620. The semiconductor structures 630 can be used to form various types of angled transistors, such as MOSFETs, TFETs, TFTs, planar transistors, other types of transistors, or some combination thereof.

An orientation of the semiconductor structures 630 are aligned with the orientation of the wafer 620 so that the orientation of the semiconductor structures 630 are unaligned with the orientation of the wafer 610. The orientation may be a crystal direction of the semiconductor structure 630. Additionally or alternatively, the orientation may be aligned with a longitudinal axis of the semiconductor structure 630 or a portion of the semiconductor structure 630. A semiconductor structure 630 includes a channel region 640, a first region 650, and a second region 660. The first region 650 and second region are the S/D regions of the angled transistor. As shown in FIG. 6B, each S/D region or the channel region extends along the Z-axis from the top surface of the wafer 620 to the bottom surface of the wafer 620 so that a thickness of a semiconductor structure 630 along the Z-axis is the same as the thickness of the wafer 620 along the Z-axis. In other embodiments, a S/D region or channel region may extend a portion of the wafer 620, as opposed to the whole wafer 620, along the Z-axis. In yet other embodiments, a semiconductor structure 630 may be over the wafer 620. For instance, the semiconductor structure 630 may be formed through epitaxy growth on the top surface of the wafer 620.

The semiconductor structures 630 can be formed by various techniques. In one example, a semiconductor structures 630 is formed by etching the wafer 620. The channel region 640 may be a portion of the wafer 620. A S/D region may be formed by doping another portion of the wafer 620. In another example, a semiconductor structures 630 is formed by doping portions of the wafer 620 to form the S/D regions and another portion of the wafer 620 that is between the S/D regions constitute the channel region 640. In yet another example, a semiconductor structures 630 is formed by spraying one or more semiconductor materials onto the top surface of the wafer 620 (that way, the semiconductor structures 630 is over the wafer 620, not in the wafer 620).

The channel region 640 includes a channel material, such as one of the channel materials described above. The channel material may be included in the wafer 620 or formed from a material in the wafer 620. In some embodiments, the S/D regions may be formed in the channel material. The S/D regions may generally be formed using either an implantation/diffusion process or an etching/deposition process. In the former process, dopants such as boron, aluminum, antimony, phosphorous, or arsenic may be ion-implanted into the channel material to form the S/D regions. An annealing process that activates the dopants and causes them to diffuse further into the channel material typically follows the ion implantation process. In the latter process, the channel material may first be etched to form recesses at the locations of the S/D regions. An epitaxial deposition process may then be carried out to fill the recesses with material that is used to fabricate the S/D regions. In some implementations, the S/D regions may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions may be formed using one or more alternate semiconductor materials such as germanium or a Group III-V material or alloy. And in further embodiments, one or more layers of metal and/or metal alloys may be used to form the S/D regions.

In some embodiments, the channel region 640 or the whole semiconductor structure 630 may be a planar structure. In other embodiments, the channel region 640 or the whole semiconductor structure 630 may be a non-planar structure, such as a fin, nanoribbon, nanowire, etc. A fin may have a height (i.e., a dimension measured along the Z-axis) between about 30 and 350 nanometers, including all values and ranges therein (e.g., between about 30 and 200 nanometers, between about 75 and 250 nanometers, or between about 650 and 300 nanometers). A fin may have a thickness (i.e., a dimension along the Y-axis) between about 4 and 65 nanometers, including all values and ranges therein (e.g., between about 5 and 60 nanometers, or between about 7 and 62 nanometers). "Nanoribbon" or "nanosheet" may be an elongated structure that has a longitudinal axis and a rectangular transverse cross-section (i.e., a cross-section in a plane perpendicular to the longitudinal axis). "Nanowire" may be elongated structure that has a longitudinal axis and a circular transverse cross-section (i.e., a cross-section in a plane perpendicular to the longitudinal axis). Typically, a length of an elongated structure (i.e., a dimension measured along the longitudinal axis, shown in the present drawings to be along the X-axis) is greater than each of a thickness (i.e., a dimension measured along the Y-axis) and a height (i.e., a dimension measured along the Z-axis).

Figure 6D:
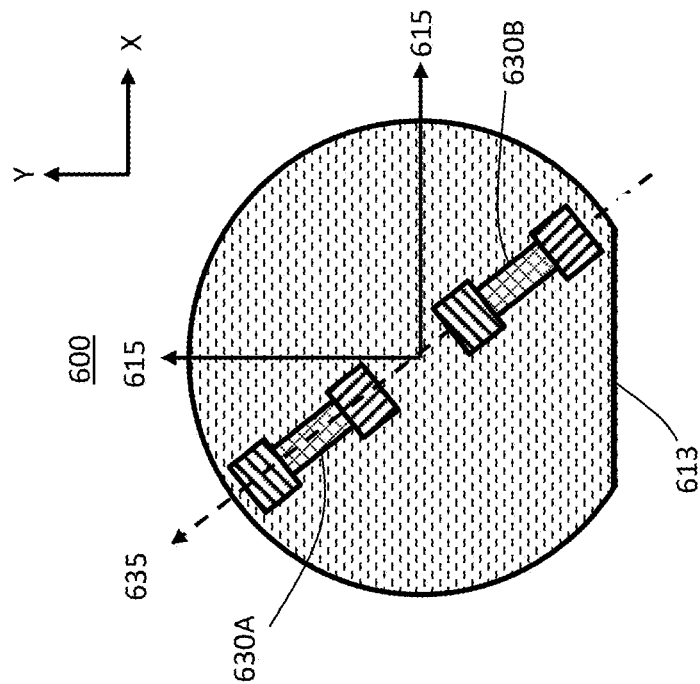
Figure 6C:
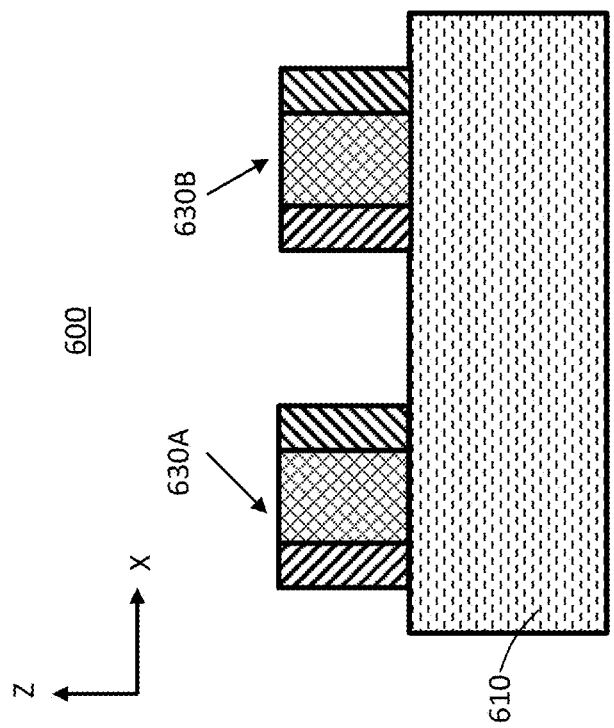

In FIGS. 6C and 6D, the wafer 620 is removed, e.g., by etching, and an IC device 600 is formed. The removal of the wafer 620 may be optional. In some embodiments, the semiconductor structures 630 are formed by removing portions of the wafer 620. In other embodiments, the wafer 620 may be remove after the semiconductor structures 630 are formed or not removed even after the semiconductor structures 630 are formed. Even though not shown in FIGS. 6C and 6D, the wafer 610 may be used as a substrate of the semiconductor structures 630 in further fabrication processes, e.g., processes of coupling the semiconductor structures 630 to other structures.

FIC. 6C shows a cross-section of the IC device 600 in an X-Z plane. The semiconductor structures 630 is over the wafer 610 and extends away from the wafer 610. In some embodiments, a semiconductor structure 630 is a fin. The fin may include a subfin between the channel region 640 and the wafer 610. In some embodiments, the subfin (or a portion of the subfin) may be formed based on the wafer 610, as opposed to the wafer 620. For instance, a portion of the wafer 610 may be etched during the formation of the semiconductor structure 630, which forms the subfin from the material of the wafer 610. The subfin may have crystal structures with a crystal direction aligned with the crystal direction of the wafer 610, i.e., not aligned with the crystal direction of the channel region 640. A gate that wraps around at least a portion of the channel region 640 may not be in contact with any portion of the subfin. In other embodiments, a portion of the subfin may be formed based on a portion of the wafer 620 and has a crystal direction aligned with the crystal direction of the channel region 640.

FIG. 6D shows a cross-section of the IC device 600 in an X-Y plane. As shown in FIG. 6D, the wafer 610 has a flat 613 and orientations 615 and 617. The orientation 615 is parallel to the flat 613, versus the orientation 617 is perpendicular to the flat 613. The semiconductor structures 630 have an orientation 635, which may be aligned with a crystal direction and/or a longitudinal axis of the semiconductor structures 630. The orientation 635 of the semiconductor structures 630 is angled from the orientations 615 and 617 of the wafer 610. In some embodiments, an angle between the orientation 635 and the orientation 615, or between the orientation 635 and the orientation 617, is in a range from 4 to 60 degrees. In some embodiments, the flat 613 may be used as a reference to place the semiconductor structures 630 into a memory device, e.g., where the semiconductor structures 630 are channel regions and S/D regions of accessing transistors of the memory device. That way, the orientation 635 can be misaligned with a longitudinal axis of a control line of the memory device so that the accessing transistors are angled transistors with respect to the control line. By using such angled accessing transistors, the memory cell density of the memory device can be improved as more accessing transistors can be placed into the memory device. The control line may be a BL or WL of the memory device.

In the embodiment of FIG. 6D, the semiconductor structures 630 have the same orientation 635. In other embodiments, the semiconductor structures 630 may have different orientations. For example, the semiconductor structure 630A is formed in the wafer 620. After that, the wafer 620 is removed and a new wafer is placed over the wafer 610. The new wafer has a different orientation from the wafer 620. The semiconductor structure 630B can be formed in the new wafer and have an orientation aligned with the orientation of the new wafer. That way, the orientation of the semiconductor structure 630B would be unaligned with the orientation of the semiconductor structure 630A.

Example Methods of Forming IC Devices with Angled Transistors

Figure 7:
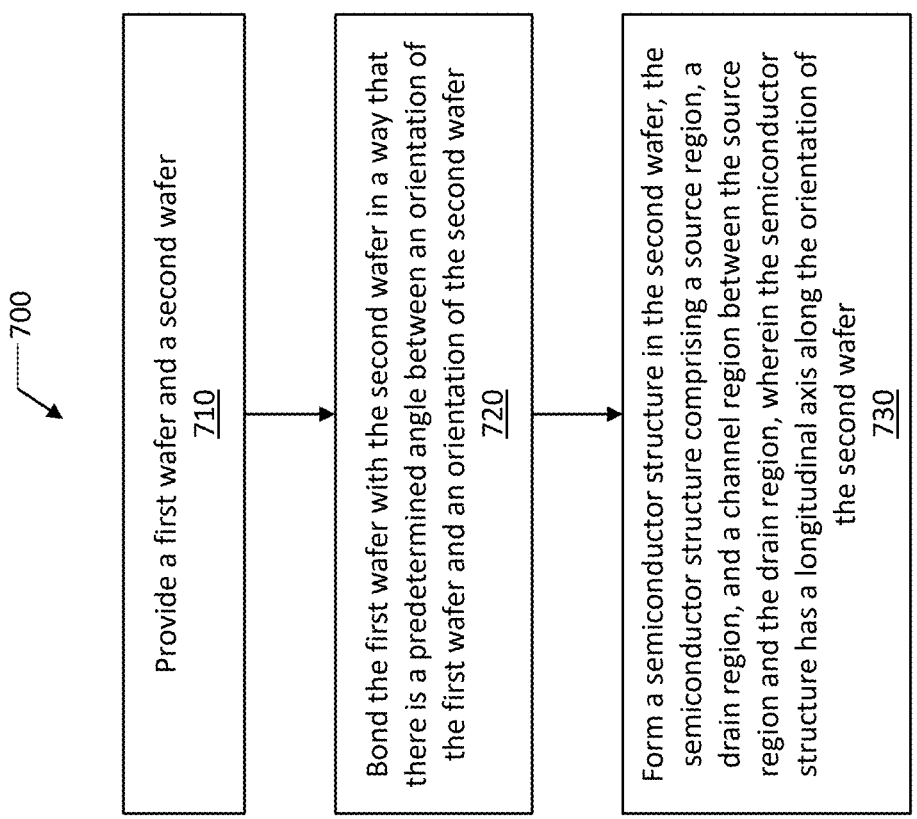
FIG. 7 is a flowchart showing a method of forming an IC device, in accordance with various embodiments.

FIG. 7 is a flowchart showing a method 700 of forming a memory device, in accordance with various embodiments. In some embodiments, the method 700 includes instructions that are stored in one or more non-transitory computer-readable media and are executable by a processing device, e.g., the processing device 2402 in FIG. 14. Although the method 700 is described with reference to the flowchart illustrated in FIG. 7, many other methods for forming IC devices may alternatively be used. For example, the order of execution of the steps in FIG. 7 may be changed. As another example, some of the steps may be changed, eliminated, or combined.

The method 700 includes providing 710 a first wafer and a second wafer. The first wafer may be the substrate 110 or the wafer 210, 310, 410, 530, or 610. The second wafer may be the substrate 120 or the wafer 220, 320, 420, 540, or 620. In some embodiments, the second wafer is formed with a semiconductor material. The first wafer may include a different material from the second wafer.

The method 700 also includes bonding 720 the first wafer with the second wafer in a way that there is a predetermined angle between an orientation of the first wafer and an orientation of the second wafer. The predetermined angle may be 4 to 60 degrees. The method 700 also includes forming 730 a semiconductor structure in the second wafer. The semiconductor structure is a structure including a semiconductor material, e.g., the semiconductor material of the second wafer.

The semiconductor structure includes a source region, a drain region, and a channel region between the source region and the drain region. The source region and drain region are doped, e.g., with dopants of the same type or different types. The semiconductor structure has a longitudinal axis along the orientation of the second wafer. In some embodiments, a thickness of the second wafer is reduced to a predetermined thickness before forming 730 the semiconductor structure or before bonding 720 the first wafer with the second wafer.

In some embodiments, the method 700 further includes forming a gate around at least a portion of the channel region to form an angled transistor. The method 700 may also include coupling the gate with a WL of a memory cell and coupling the source region with a BL of the memory cell. The semiconductor structure of the angled transistor may be angled with respect to a longitudinal axis of the BL, a longitudinal axis of the WL, or both, which can result in higher memory cell density compared with other types of transistors.

Figure 8:
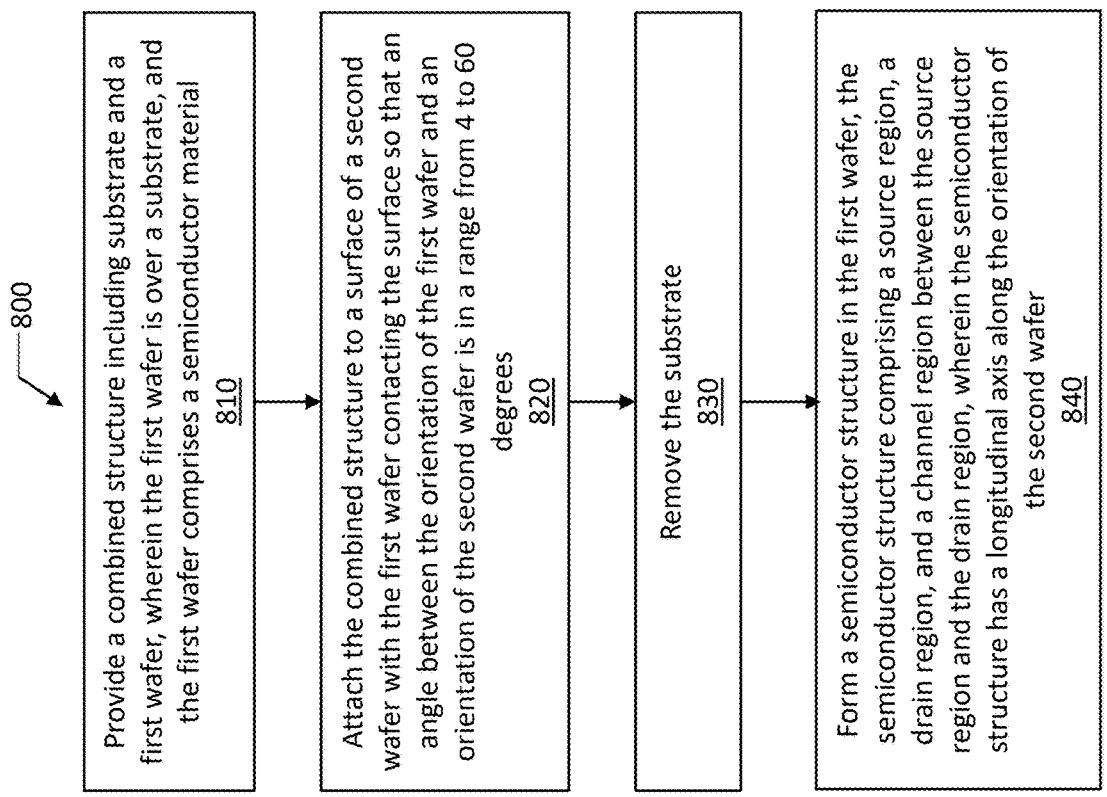
FIG. 8 is a flowchart showing another method of forming an IC device, in accordance with various embodiments.

FIG. 8 is a flowchart showing a method 800 of forming a memory device, in accordance with various embodiments. In some embodiments, the method 800 includes instructions that are stored in one or more non-transitory computer-readable media and are executable by a processing device, e.g., the processing device 2402 in FIG. 14. Although the method 800 is described with reference to the flowchart illustrated in FIG. 8, many other methods for forming IC devices may alternatively be used. For example, the order of execution of the steps in FIG. 8 may be changed. As another example, some of the steps may be changed, eliminated, or combined.

The method 800 includes providing 810 a combined structure including substrate and a first wafer. The first wafer is over a substrate and the first wafer comprises a semiconductor material. The first wafer may be the substrate 120 or the wafer 220, 320, 420, 540, or 620.

The method 800 also includes attaching 820 the combined structure to a surface of a second wafer with the first wafer contacting the surface so that an angle between an orientation of the first wafer and an orientation of the second wafer is in a range from 4 to 60 degrees. The second wafer may be the substrate 110 or the wafer 210, 310, 410, 530, or 610. In some embodiments, the second wafer may include a different material from the first wafer. The first wafer may have a size (e.g., a cross-sectional area) that is smaller or the same as a size of the second wafer.

The method 800 also includes removing 830 the substrate. The method 800 also includes forming 840 a semiconductor structure in the first wafer. The semiconductor structure has a longitudinal axis along an orientation of the first wafer. The semiconductor structure is a structure including a semiconductor material, e.g., the semiconductor material of the second wafer.

The semiconductor structure includes a source region, a drain region, and a channel region between the source region and the drain region. The source region and drain region are doped, e.g., with dopants of the same type or different types. The semiconductor structure has a longitudinal axis along the orientation of the second wafer. In some embodiments, a thickness of the second wafer is reduced to a predetermined thickness before forming 840 the semiconductor structure.

In some embodiments, the semiconductor structure is formed by doping a first section of the first wafer with a type of dopant to form the source region and doping a second section of the first wafer with the type of dopant to form the drain region.

Example Memory Array with Angled Transistors

Figure 9:
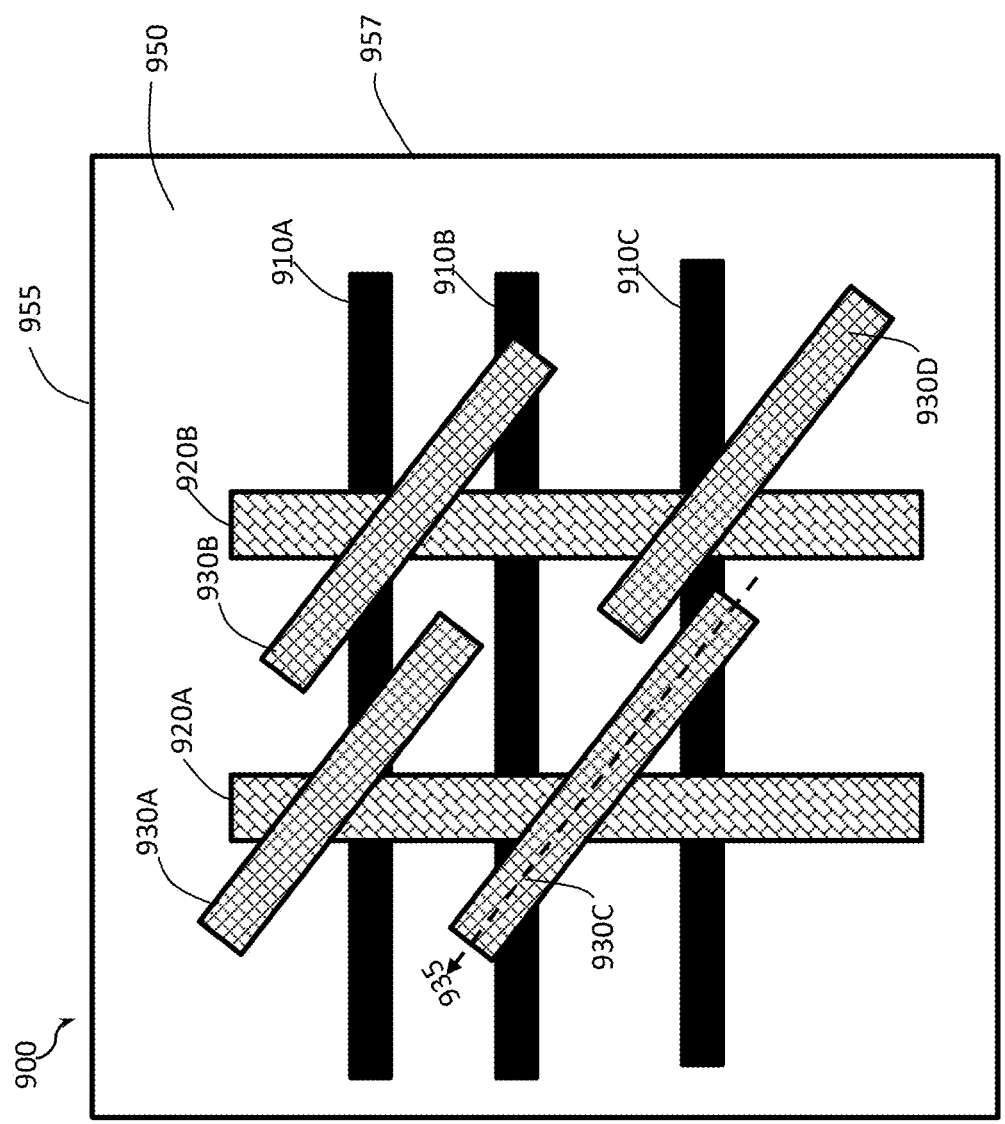
FIG. 9 is a schematic diagram of a memory array, according to some embodiments of the disclosure.

FIG. 9 is a schematic diagram of a memory array 900, according to some embodiments of the present disclosure. FIG. 9 also shows a reference coordinate system that includes an X-axis and a Y-axis, which are orthogonal to each other. The memory array 900 includes WLs 910A-C (collectively referred to as "WLs 910" or "WL 910"), BLs 920A and 920B (collectively referred to as "BLs 920" or "BL 920"), and angled transistors 930A-D (collectively referred to as "angled transistors 930" or "angled transistor 930"), and a substrate 950. In other embodiments, the memory array 900 may include more, fewer, or different components.

The substrate 950 may be an embodiment of the substrate 110, or the wafer 210, 310, 410, 530, or 610. A WL 910 or BL 920 may be over the substrate 950 or at least partially in the substrate 950. In the embodiment of FIG. 9, the WLs 910 have longitudinal axes along the X-axis, the BLs 920 have longitudinal axes along the Y-axis. In other embodiments, the WLs and BLs may be oriented differently. The WLs 910 and BLs 920 forms an array.

The angled transistors 930 are over the substrate 950. An angled transistor 930 may be an embodiment of the angled transistor 130 in FIG. 1. The angled transistors 930 have longitudinal axes 935 (individually referred to as longitudinal axis 935) that are in parallel. As shown in FIG. 9, the longitudinal axis 935 is not aligned with an edge 955 or 957 of the substrate 950. Rather, the longitudinal axis 935 is angled with respect to the edge 955 or 957. An angle between the longitudinal axes 935 and the edge 955 or 957 may be in a range from 4 to 60 degrees. Such an angled arrangement of the angled transistors 930, compared with angled transistors that are aligned with edges 955 and 957, allows more angled transistors 930 to be placed over the substrate 950. Thus, the usage of the angled transistors 930 can improve memory cell density in the memory array 900.

In the embodiments of FIG. 9, the longitudinal axis 935 is also not aligned with either the longitudinal axes of the WLs 910 or the longitudinal axes of the BLs 920. An angle between the longitudinal axes 935 and the longitudinal axes of the WLs 910 or the BLs 920 may be in a range from 4 to 60 degrees. In other embodiments, the longitudinal axis 935 may be aligned with either the longitudinal axes of the WLs 910 or the longitudinal axes of the BLs 920, or the angle may be in a different range.

Example Memory Array

Figure 10:
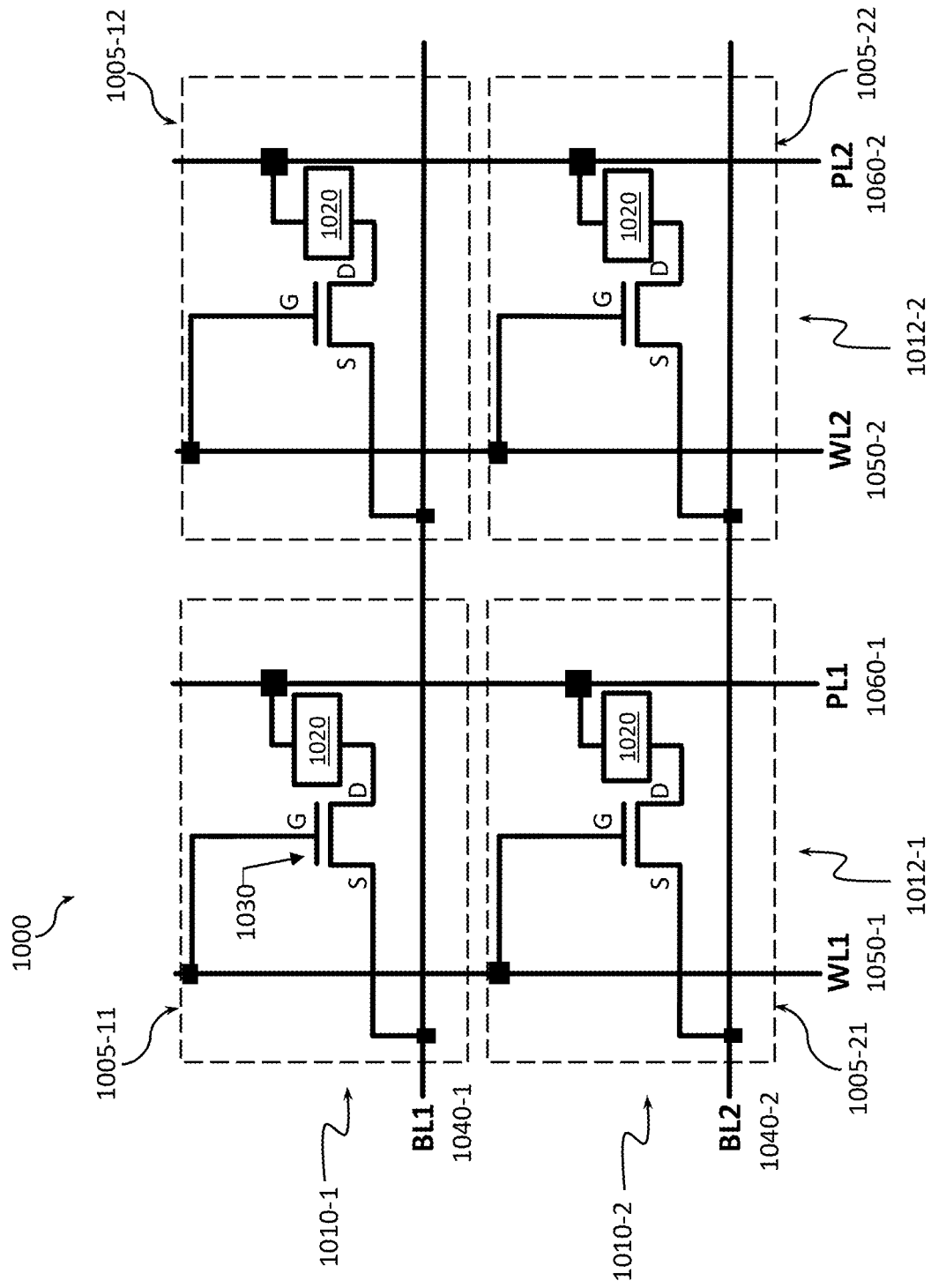
FIG. 10 is an electric circuit diagram of a memory array, according to some embodiments of the present disclosure.

FIG. 10 is an electric circuit diagram of a memory array 1000, according to some embodiments of the present disclosure. The memory array 1000 is an array of memory cells 1005-11, 1005-12, 1005-21, and 1005-22 (collectively referred to as "memory cells 1005" or "memory cell 1005"), which are arranged in rows 1010-1 and 1010-2 (collectively referred to as "rows 1010" or "row 1010") and columns 1012-1 and 1012-2 (collectively referred to as "columns 1012" or "column 1012"). Each memory cell 1005 is illustrated within one of the dashed boxes in FIG. 10.

The memory array 1000 also includes three types of control lines: BLs 1040-1 and 1040-2 (collectively referred to as "BLs 1040" or "BL 1040"), WLs 1050-1 and 1050-2 (collectively referred to as "WLs 1050" or "WL 1050"), and platelines (PLs) 1060-1 and 1060-2 (collectively referred to as "PLs 1060" or "PL 1060"), which control the memory cells 1005. The memory cells 1005 in the row 1010-1 are coupled to the same BL 1040-1. The memory cells in the row 1010-1 are coupled to the same BL 1040-2. The memory cells in the column 1012-1 are coupled to the same WL 1050-2 and the same PL 1060-2. The memory cells in the column 1012-2 are coupled to the same WL 1050-1 and the same PL 1060-1. As is conventionally used in context of memory, the terms "row" and "column" do not reflect the, respectively, horizontal and vertical orientation on a page of a drawing illustrating a memory array but, instead, reflect how individual memory cells are addressed. Namely, memory cells 1005 sharing a single BL 1040 are said to be in the same row, while memory cells sharing a single WL 1050 and a single PL 1060 are said to be on the same column. In other embodiments, the memory array 1000 may include a different number of memory cells, BLs, WLs, or PLs. Furthermore, in other embodiments, the memory cells 1005 may be arranged in arrays in a manner other than what is shown in FIG. 10, e.g., in any suitable manner of arranging memory cells into arrays as known in the art, all of which being within the scope of the present disclosure.

A memory cell 1005 may store one bit of binary information. Each memory cell 1005 is a 1T-1X memory cell. The memory cell 1005 includes a memory element 1020 and an access transistor 1030. The memory element 1020 is configured to store signals. The memory element 1020 may have more than one states. The memory element 1020 having two states may be referred to as a binary memory element. In other embodiments, the memory element 1020 may have more than two states. In some embodiments, the memory element 1020 is a capacitor that can store electrical voltage signals, and the memory cell 1005 is a one-transistor one-capacitor (1T-1C) memory cell. In other embodiments, the memory element 1020 may be, for example, a ferroelectric memory element, a magnetic storage element, a resistor, or another transistor, coupled to the access transistor 1030. Also, the memory element 1020 may store signals other than electrical voltage signals.

The access transistor 1030 controls access to the memory cell 1005. For instance, the access transistor 1030 controls access to write information to the memory cell 1005, access to read information from the memory cell 1005, or both. The access transistor 1030 has a gate terminal, a source terminal, and a drain terminal, indicated in the example of FIG. 10 as terminals G, S, and D, respectively.

An embodiment of the access transistor 1030 may be an angled transistor, such as the angled transistor 130 described above in conjunction in FIG. 1. A longitudinal axis of the access transistor 1030 may be angled (i.e., unaligned) with respect to a longitudinal axis of the BL 1040, WL 1050, or PL 1060. Such misalignment allows more access transistor 1030 to be placed in the memory array 1000 to form more memory cells 1005, which can increase storage capacity of the memory array 1000.

The access transistor 1030 may be a nanowire-based or nanoribbon-based transistor (or, simply, a nanowire transistor or nanoribbon transistor). In a nanowire or nanoribbon transistor, a gate stack that may include a stack of one or more gate electrode metals and, optionally, a stack of one or more gate insulators may be provided around a portion of an elongated semiconductor structure called "nanowire or nanoribbon", forming a gate on all sides of the nanowire or nanoribbon. The portion of the nanowire or nanoribbon around which the gate stack wraps around is referred to as a "channel" or a "channel portion." A semiconductor material of which the channel portion of the nanoribbon is formed is commonly referred to as a "channel material." A source region and a drain region are provided on the opposite ends of the nanowire or nanoribbon, on either side of the gate stack, forming, respectively, a source and a drain of such a transistor. Wrap-around or all-around gate transistors, such as nanoribbon and nanowire transistors, may provide advantages compared to other transistors having a non-planar architecture, such as FinFETs, and transistors having planar architecture. In the following, the terms "terminal" and "electrode" may be used interchangeably. Furthermore, for S/D terminals, the terms "terminal" and "region" may be used interchangeably.

As shown in FIG. 10, the gate terminal of the access transistor 1030 is coupled to a WL 1050, one of the S/D terminals of the access transistor 1030 is coupled to a BL 1040, and the other one of the S/D terminals of the access transistor 1030 is coupled to a first terminal of the memory element 1020, e.g., a first electrode of a capacitor. As also shown in FIG. 10, the other terminal of the memory element 1020 may be coupled to a capacitor PL 1060. As is known in the art, WL, BL, and PL may be used together to read and program the memory element 1020. In some embodiments (e.g., embodiments where the access transistor 1030 is the vertical transistor 105), a portion of the BL 1040 may be a S/D region of the access transistor 1030. Another S/D region of the access transistor 1030 is coupled to the memory element 1020. Also, a portion of the WL 1050 may be a gate electrode of the access transistor 1030. Such vertical transistors can improve the memory cell density of the memory array 1000 so that more memory cells can be arranged in the available space of the memory array 1000.

Each of the BL 1040, the WL 1050, and the PL 1060, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

In the embodiment of FIG. 10, a single PL 1060 is shared among multiple memory cells 1005 of a given row. The PLs 1060 are shared among the same memory cells 1005 among which the WL 1050 are shared. Such an arrangement where the PLs 1060 are shared among the same memory cells among which the WLs 1050 are shared may be described as an arrangement where the PLs 1060 are "parallel" to the WLs 1050. Each memory cell 1005 of the memory array 1000 where the PLs 1060 are parallel to the WLs 1050, e.g., as shown in FIG. 10, may then be addressed (e.g., to perform READ and WRITE operations) by using the WL 1050 and the PL 1060 corresponding to the column 1012 to which the memory cell 1005 belongs and by using the BL 1040 corresponding to the row 1010 to which the memory cell 1005 belongs.

It should be noted that, just as the horizontal and vertical orientations on a page of an electrical circuit diagram illustrating a memory array does imply functional division of memory cells into rows and columns as used in common language, the orientation of various elements on a page of an electrical circuit diagram illustrating a memory array does not imply that the same orientation is used for the actual physical layout of a memory array. For example, in an IC device implementing the memory array 1000 as shown in FIG. 2A, corresponding BLs 1040 and PLs 1060 (i.e., a pair of a BL 1040 and a PL 1060 coupled to a given column 1012) do not have to physically extend in a direction parallel to one another (although they may), or the WLs 1050 do not have to physically extend in a direction perpendicular to the BLs 1040 (although they may). In another example, in an IC device implementing the memory array 1000 as shown in FIG. 10, corresponding WLs 1050 and PLs 1060 (i.e., a pair of a WL 1050 and a PL 1060 coupled to a given column 1012) do not have to physically extend in a direction parallel to one another (although they may), or the WLs 1050 do not have to physically extend in a direction perpendicular to the BLs 1040 (although they may).

Example Wafer and Die

Figure 11B:
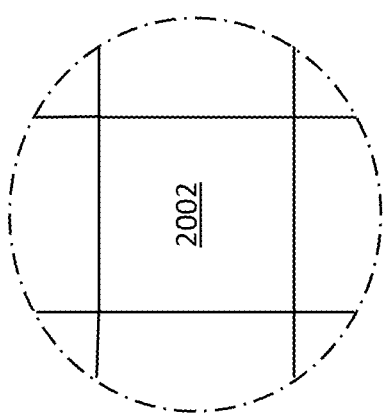
FIGS. 11A-11B are top views of a wafer and dies that may include one or more angled transistors, according to some embodiments of the disclosure.
Figure 11A:
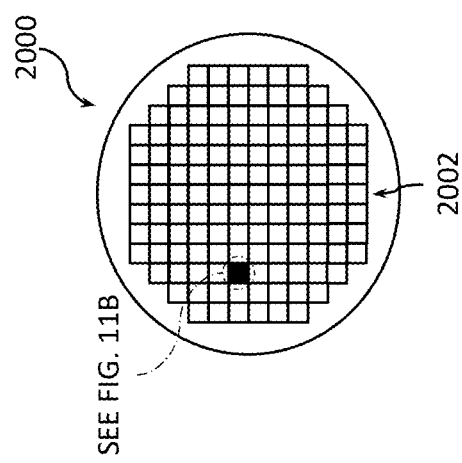

FIGS. 11A-11B are top views of a wafer 2000 and dies 2002 that may include one or more angled transistors, according to some embodiments of the disclosure. In some embodiments, the dies 2002 may be included in an IC package, according to some embodiments of the disclosure. For example, any of the dies 2002 may serve as any of the dies 2256 in an IC package 2200 shown in FIG. 12. The wafer 2000 may be composed of semiconductor material and may include one or more dies 2002 having IC devices formed on a surface of the wafer 2000. Each of the dies 2002 may be a repeating unit of a semiconductor product that includes any suitable IC (e.g., ICs including one or more angled transistors as described herein). After the fabrication of the semiconductor product is complete (e.g., after manufacture of one or more angled transistors as described herein), the wafer 2000 may undergo a singulation process in which each of the dies 2002 is separated from one another to provide discrete "chips" of the semiconductor product. In particular, devices that include one or more angled transistors as disclosed herein may take the form of the wafer 2000 (e.g., not singulated) or the form of the die 2002 (e.g., singulated). The die 2002 may include one or more diodes, one or more transistors (e.g., one or more III-N transistors as described herein) as well as, optionally, supporting circuitry to route electrical signals to the III-N diodes with n-doped wells and capping layers and III-N transistors, as well as any other IC components. In some embodiments, the wafer 2000 or the die 2002 may implement an electrostatic discharge (ESD) protection device, an RF FE device, a memory device (e.g., a SRAM device), a logic device (e.g., an AND, OR, NAND, or NOR gate), or any other suitable circuit element. Multiple ones of these devices may be combined on a single die 2002.

Example IC Package

Figure 12:
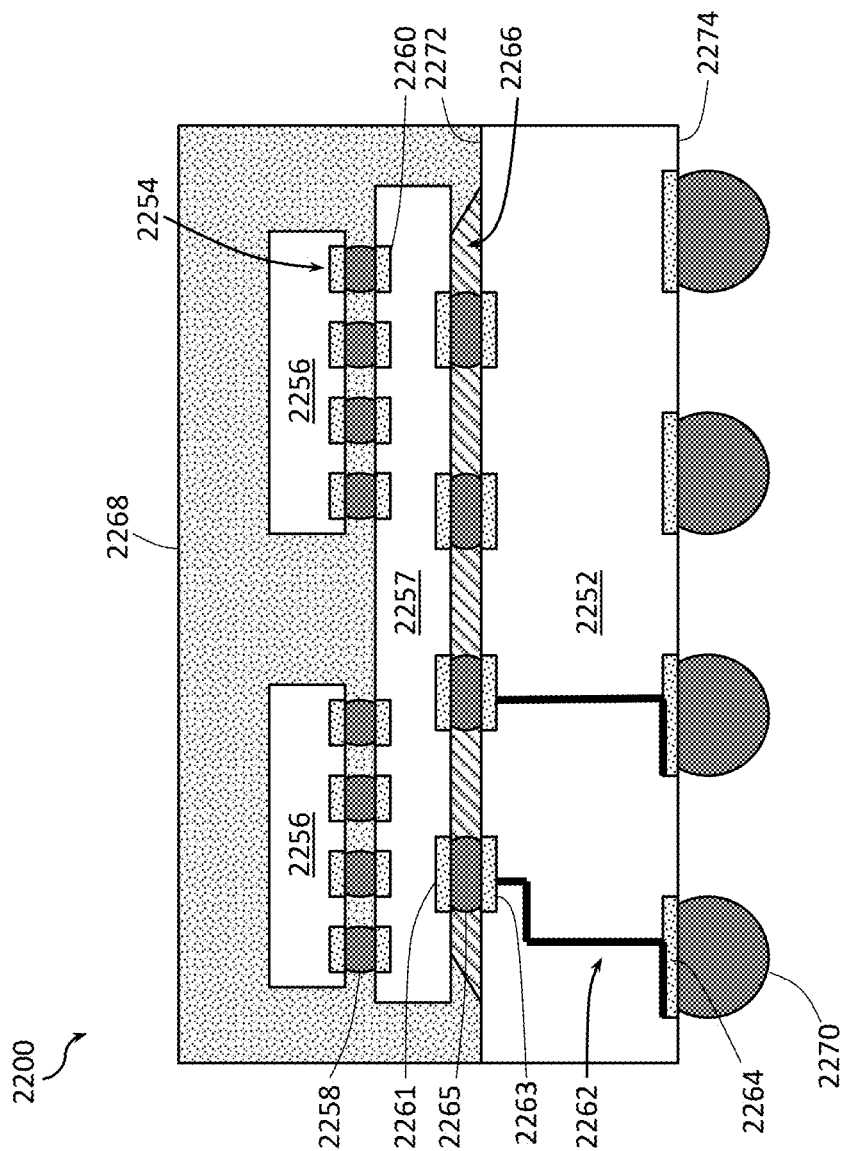
FIG. 12 is a side, cross-sectional view of an example IC package that may include one or more IC devices having angled transistors, according to some embodiments of the disclosure.

FIG. 12 is a side, cross-sectional view of an example IC package 2200 that may include one or more IC devices having angled transistors, according to some embodiments of the disclosure. In some embodiments, the IC package 2200 may be a system-in-package (SiP).

As shown in FIG. 12, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 12 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 12 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 12 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 13.

The dies 2256 may take the form of any of the embodiments of the die 2002 discussed herein and may include any of the embodiments of an IC device having one or more angled transistors. In embodiments in which the IC package 2200 includes multiple dies 2256, the IC package 2200 may be referred to as a multi-chip package. Importantly, even in such embodiments of an MCP implementation of the IC package 2200, one or more angled transistors may be provided in a single chip, in accordance with any of the embodiments described herein. The dies 2256 may include circuitry to perform any desired functionality. For example, one or more of the dies 2256 may be ESD protection dies, including one or more angled transistors as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more angled transistors, e.g., as discussed above; in some embodiments, at least some of the dies 2256 may not include any III-N diodes with n-doped wells and capping layers.

The IC package 2200 illustrated in FIG. 12 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 12, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Example IC Device

Figure 13:
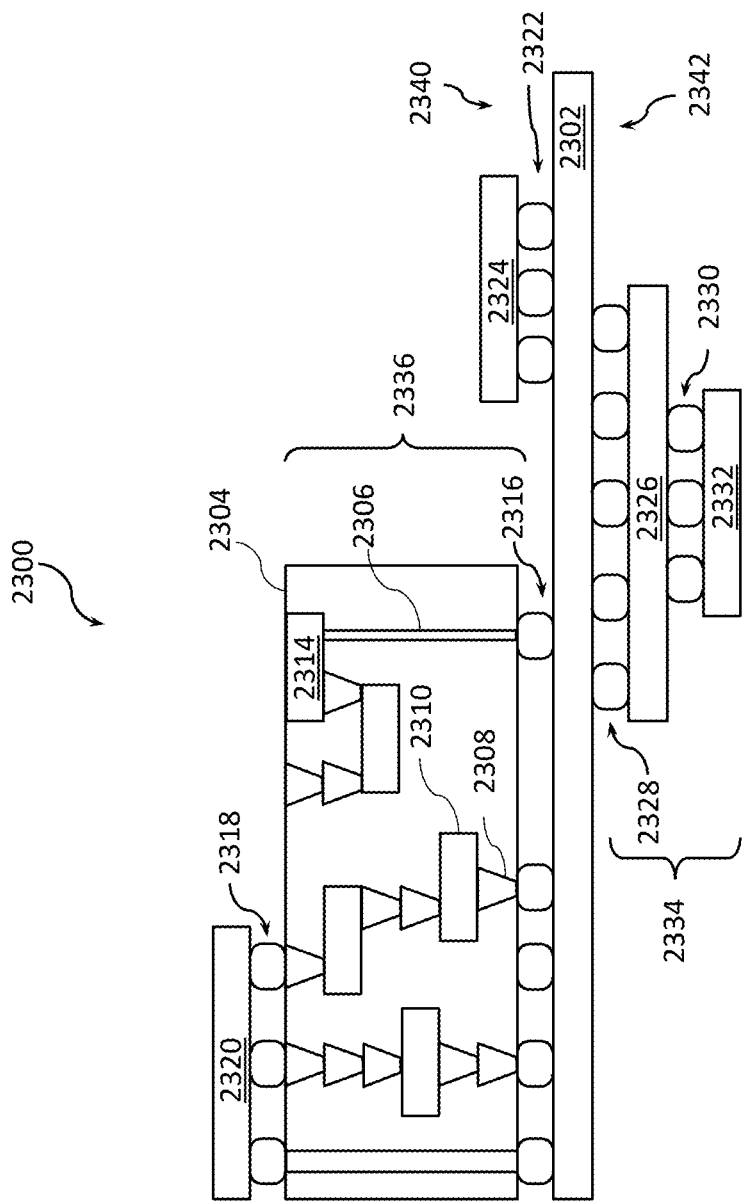
FIG. 13 is a cross-sectional side view of an IC device assembly that may include components having one or more IC devices implementing angled transistors, according to some embodiments of the disclosure.

FIG. 13 is a cross-sectional side view of an IC device assembly 2300 that may include components having one or more IC devices implementing angled transistors, according to some embodiments of the disclosure. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more angled transistors in accordance with any of the embodiments disclosed herein; e.g., any of the IC packages discussed below with reference to the IC device assembly 2300 may take the form of any of the embodiments of the IC package 2200 discussed above with reference to FIG. 12 (e.g., may include one or more angled transistors in/on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 13 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 13), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 11B), an IC device (e.g., the IC device of FIG. 1-2), or any other suitable component. In particular, the IC package 2320 may include one or more angled transistors as described herein. Although a single IC package 2320 is shown in FIG. 13, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 13, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other Group III-V and Group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more angled transistors as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 13 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Example Computing Device

Figure 14:
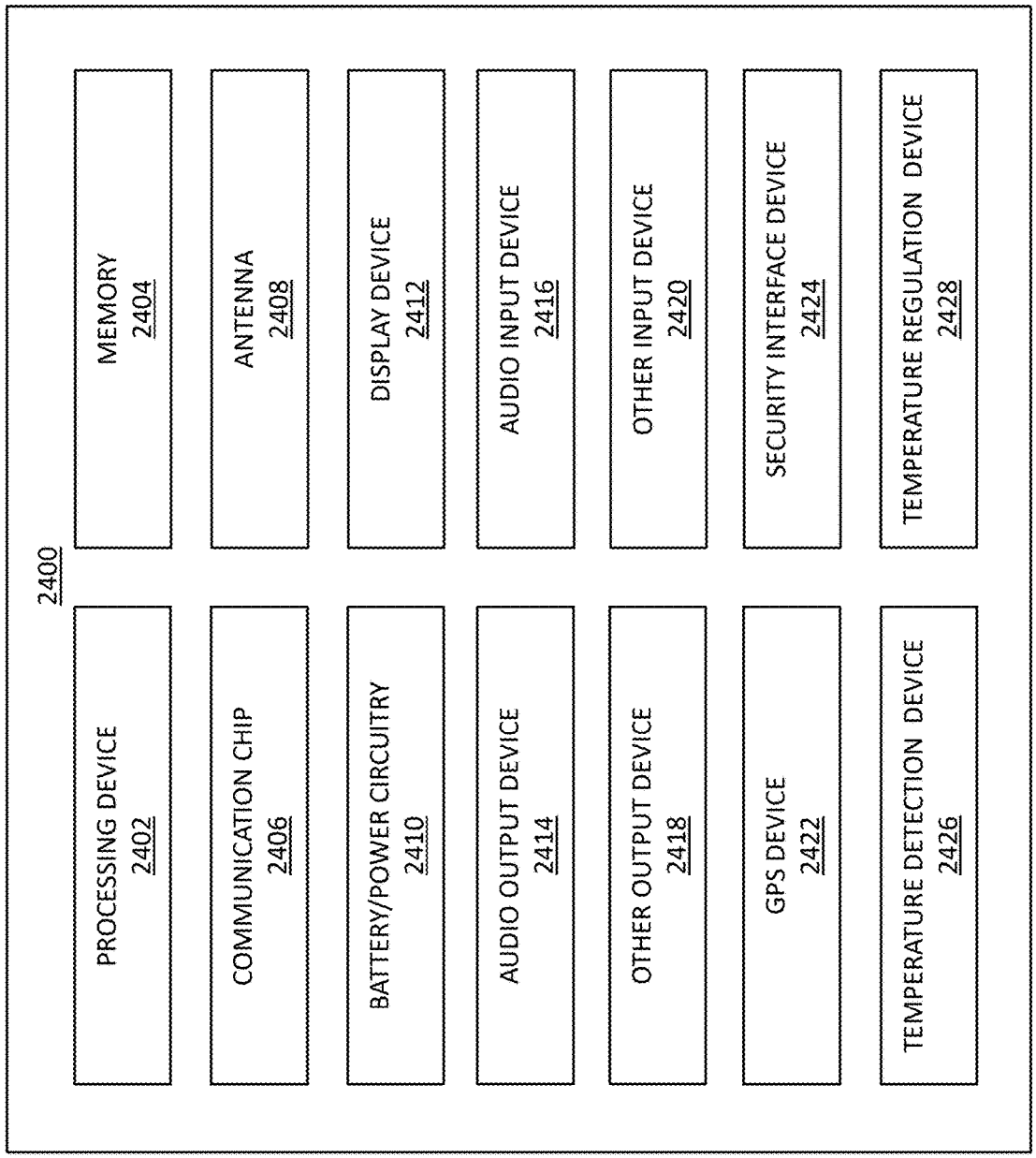
FIG. 14 is a block diagram of an example computing device that may include one or more components with angled transistors, according to some embodiments of the disclosure.

FIG. 14 is a block diagram of an example computing device 2400 that may include one or more components including one or more angled transistors in accordance with any of the embodiments disclosed herein. For example, any suitable ones of the components of the computing device 2400 may include a die (e.g., the die 2002 (FIG. 11B)) having one or more angled transistors. Any one or more of the components of the computing device 2400 may include, or be included in, an IC device 2200 (FIG. 12). Any one or more of the components of the computing device 2400 may include, or be included in, an IC device assembly 2300 (FIG. 13).

A number of components are illustrated in FIG. 14 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 14, but the computing device 2400 may include interface circuitry for coupling to the one or more components. For example, the computing device 2400 may not include a display device 2412, but may include display device interface circuitry (e.g., a connector and driver circuitry) to which a display device 2412 may be coupled. In another set of examples, the computing device 2400 may not include an audio input device 2416 or an audio output device 2414, but may include audio input or output device interface circuitry (e.g., connectors and supporting circuitry) to which an audio input device 2416 or audio output device 2414 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM, nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded DRAM (eDRAM) or spin transfer torque magnetic random-access memory (STT-MRAM).

In some embodiments, the computing device 2400 may include a communication chip 2406 (e.g., one or more communication chips). For example, the communication chip 2406 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2406 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2406 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2406 may operate in accordance with other wireless protocols in other embodiments. The computing device 2400 may include an antenna 2408 to facilitate wireless communications and/or to receive other wireless communications (such as AM or FM radio transmissions).

In some embodiments, the communication chip 2406 may manage wired communications, such as electrical, optical, or any other suitable communication protocols (e.g., the Ethernet). As noted above, the communication chip 2406 may include multiple communication chips. For instance, a first communication chip 2406 may be dedicated to shorter-range wireless communications such as Wi-Fi or Bluetooth, and a second communication chip 2406 may be dedicated to longer-range wireless communications such as global positioning system (GPS), EDGE, GPRS, CDMA, WiMAX, LTE, EV-DO, or others. In some embodiments, a first communication chip 2406 may be dedicated to wireless communications, and a second communication chip 2406 may be dedicated to wired communications.

The computing device 2400 may include a battery/power circuitry 2410. The battery/power circuitry 2410 may include one or more energy storage devices (e.g., batteries or capacitors) and/or circuitry for coupling components of the computing device 2400 to an energy source separate from the computing device 2400 (e.g., AC line power).

The computing device 2400 may include a display device 2412 (or corresponding interface circuitry, as discussed above). The display device 2412 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2414 (or corresponding interface circuitry, as discussed above). The audio output device 2414 may include any device that generates an audible indicator, such as speakers, headsets, or earbuds, for example.

The computing device 2400 may include an audio input device 2416 (or corresponding interface circuitry, as discussed above). The audio input device 2416 may include any device that generates a signal representative of a sound, such as microphones, microphone arrays, or digital instruments (e.g., instruments having a musical instrument digital interface (MIDI) output).

The computing device 2400 may include an other output device 2418 (or corresponding interface circuitry, as discussed above). Examples of the other output device 2418 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may include a GPS device 2422 (or corresponding interface circuitry, as discussed above). The GPS device 2422 may be in communication with a satellite-based system and may receive a location of the computing device 2400, as known in the art.

The computing device 2400 may include a security interface device 2424. The security interface device 2424 may include any device that provides security features for the computing device 2400 or for any individual components therein (e.g., for the processing device 2402 or for the memory 2404). Examples of security features may include authorization, access to digital certificates, access to items in keychains, etc. Examples of the security interface device 2424 may include a software firewall, a hardware firewall, an antivirus, a content filtering device, or an intrusion detection device.

In some embodiments, the computing device 2400 may include a temperature detection device 2426 and a temperature regulation device 2428.

The temperature detection device 2426 may include any device capable of determining temperatures of the computing device 2400 or of any individual components therein (e.g., temperatures of the processing device 2402 or of the memory 2404). In various embodiments, the temperature detection device 2426 may be configured to determine temperatures of an object (e.g., the computing device 2400, components of the computing device 2400, devices coupled to the computing device, etc.), temperatures of an environment (e.g., a data center that includes, is controlled by, or otherwise associated with the computing device 2400), and so on. The temperature detection device 2426 may include one or more temperature sensors. Different temperature sensors of the temperature detection device 2426 may have different locations within and around the computing device 2400. A temperature sensor may generate data (e.g., digital data) representing detected temperatures and provide the data to another device, e.g., to the temperature regulation device 2428, the processing device 2402, the memory 2404, etc. In some embodiments, a temperature sensor of the temperature detection device 2426 may be turned on or off, e.g., by the processing device 2402 or an external system. The temperature sensor detects temperatures when it is on and does not detect temperatures when it is off. In other embodiments, a temperature sensor of the temperature detection device 2426 may detect temperatures continuously and automatically or detect temperatures at predefined times or at times triggered by an event associated with the computing device 2400 or any components therein.

The temperature regulation device 2428 may include any device configured to change (e.g., decrease) temperatures, e.g., based on one or more target temperatures and/or based on temperature measurements performed by the temperature detection device 2426. A target temperature may be a preferred temperature. A target temperature may depend on a setting in which the computing device 2400 operates. In some embodiments, the target temperature may be 200 Kelvin degrees or lower. In some embodiments, the target temperature may be 20 Kelvin degrees or lower, or 5 Kelvin degrees or lower. Target temperatures for different objects and different environments of, or associated with, the computing device 2400 can be different. In some embodiments, cooling provided by the temperature regulation device 2428 may be a multi-stage process with temperatures ranging from room temperature to 4K or lower.

In some embodiments, the temperature regulation device 2428 may include one or more cooling devices. Different cooling device may have different locations within and around the computing device 2400. A cooling device of the temperature regulation device 2428 may be associated with one or more temperature sensors of the temperature detection device 2426 and may be configured to operate based on temperatures detected the temperature sensors. For instance, a cooling device may be configured to determine whether a detected ambient temperature is above the target temperature or whether the detected ambient temperature is higher than the target temperature by a predetermined value or determine whether any other temperature-related condition associated with the temperature of the computing device 2400 is satisfied. In response to determining that one or more temperature-related condition associated with the temperature of the computing device 2400 are satisfied (e.g., in response to determining that the detected ambient temperature is above the target temperature), a cooling device may trigger its cooling mechanism and start to decrease the ambient temperature. Otherwise, the cooling device does not trigger any cooling. A cooling device of the temperature regulation device 2428 may operate with various cooling mechanisms, such as evaporation cooling, radiation cooling, conduction cooling, convection cooling, other cooling mechanisms, or any combination thereof. A cooling device of the temperature regulation device 2428 may include a cooling agent, such as a water, oil, liquid nitrogen, liquid helium, etc. In some embodiments, the temperature regulation device 2428 may be, for example, a dilution refrigerator, a helium-3 refrigerator, or a liquid helium refrigerator. In some embodiments, the temperature regulation device 2428 or any portions thereof (e.g., one or more of the individual cooling devices) may be connected to the computing device 2400 in close proximity (e.g., less than about 1 meter) or may be provided in a separate enclosure where a dedicated heat exchanger (e.g., a compressor, a heating, ventilation, and air conditioning (HVAC) system, liquid helium, liquid nitrogen, etc.) may reside.

By maintaining the target temperatures, the energy consumption of the computing device 2400 (or components thereof) can be reduced, while the computing efficiency may be improved. For example, when the computing device 2400 (or components thereof) operates at lower temperatures, energy dissipation (e.g., heat dissipation) may be reduced. Further, energy consumed by semiconductor components (e.g., energy needed for switching transistors of any of the components of the computing device 2400) can also be reduced. Various semiconductor materials may have lower resistivity and/or higher mobility at lower temperatures. That way, the electrical current per unit supply voltage may be increased by lowering temperatures. Conversely, for the same current that would be needed, the supply voltage may be lowered by lowering temperatures. As energy correlates to the supply voltage, the energy consumption of the semiconductor components may lower too. In some implementations, the energy savings due to reducing heat dissipation and reducing energy consumed by semiconductor components of the computing device or components thereof may outweigh (sometimes significantly outweigh) the costs associated with energy needed for cooling.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 15:
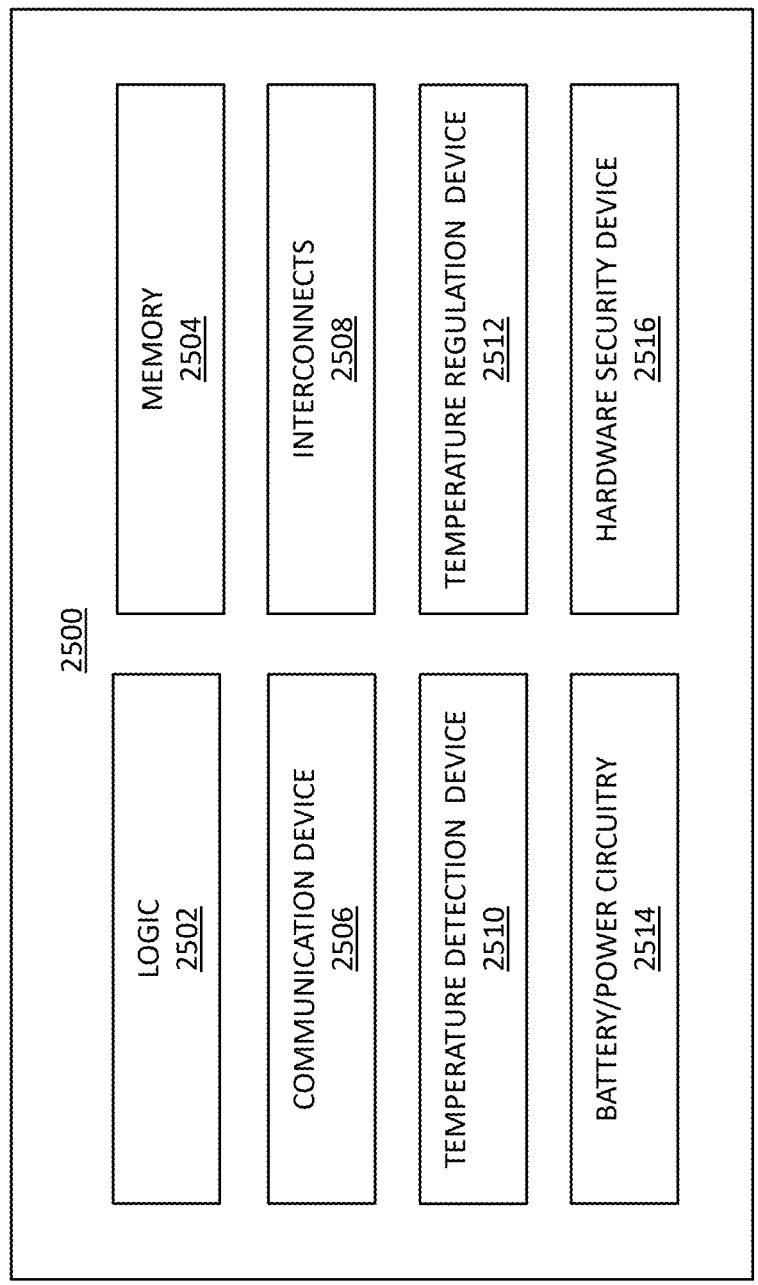
FIG. 15 is a block diagram of an example processing device that may include one or more angled transistors, according to some embodiments of the disclosure.

FIG. 15 is a block diagram of an example processing device 2500 that may include one or more angled transistors in accordance with any of the embodiments disclosed herein. For example, any suitable ones of the components of the processing device 2500 may include a die (e.g., the die 2002 (FIG. 11B)) having one or more angled transistors. Any one or more of the components of the processing device 2500 may include, or be included in, an IC device 2200 (FIG. 12). Any one or more of the components of the processing device 2500 may include, or be included in, an IC device assembly 2300 (FIG. 13). Any one or more of the components of the processing device 2500 may include, or be included in, a computing device 2400 (FIG. 14); for example, the processing device 2500 may be the processing device 2402 of the computing device 2400.

A number of components are illustrated in FIG. 15 as included in the processing device 2500, but any one or more of these components may be omitted or duplicated, as suitable for the application. In some embodiments, some or all of the components included in the processing device 2500 may be attached to one or more motherboards. In some embodiments, some or all of these components are fabricated on a single SoC die or coupled to a single support structure, e.g., to a single carrier substrate.

Additionally, in various embodiments, the processing device 2500 may not include one or more of the components illustrated in FIG. 15, but the processing device 2500 may include interface circuitry for coupling to the one or more components. For example, the processing device 2500 may not include a memory 2504, but may include display device interface circuitry (e.g., a connector and driver circuitry) to which a memory 2504 may be coupled.

The processing device 2500 may include logic circuitry 2502 (e.g., one or more circuits configured to implement logic/compute functionality). Examples of such circuits include ICs implementing one or more of input/output (I/O) functions, arithmetic operations, pipelining of data, etc.

In some embodiments, the logic circuitry 2502 may include one or more circuits responsible for read/write operations with respect to the data stored in the memory 2504. To that end, the logic circuitry 2502 may include one or more I/O ICs configured to control access to data stored in the memory 2504.

In some embodiments, the logic circuitry 2502 may include one or more high-performance compute dies, configured to perform various operations with respect to data stored in the memory 2504 (e.g., arithmetic and logic operations, pipelining of data from one or more memory dies of the memory 2504, and possibly also data from external devices/chips). In some embodiments, the logic circuitry 2502 may be configured to only control I/O access to data but not perform any operations on the data. In some embodiments, the logic circuitry 2502 may implement ICs configured to implement I/O control of data stored in the memory 2504, assemble data from the memory 2504 for transport (e.g., transport over a central bus) to devices/chips that are either internal or external to the processing device 2500, etc. In some embodiments, the logic circuitry 2502 may not be configured to perform any operations on the data besides I/O and assembling for transport to the memory 2504.

The processing device 2500 may include a memory 2504, which may include one or more ICs configure to implement memory circuitry (e.g., ICs implementing one or more of memory devices, memory arrays, control logic configured to control the memory devices and arrays, etc.). In some embodiments, the memory 2504 may be implemented substantially as described above with reference to the memory 1604 (FIG. 16). In some embodiments, the memory 2504 may be a designated device configured to provide storage functionality for the components of the processing device 2500 (i.e., local), while the memory 1604 may be configured to provide system-level storage functionality for the entire computing device 1600 (i.e., global). In some embodiments, the memory 2504 may include memory that shares a die with the logic circuitry 2502.

In some embodiments, the memory 2504 may include a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the memory 2504 may be a memory that is not divided into hierarchical layer or levels in terms of access of its data.

In some embodiments, the memory 2504 may include a hierarchical memory. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, i.e., the size and capabilities of each component. With hierarchical memory, each of the various memory components can be viewed as part of a hierarchy of memories $(m_1, m_2, \ldots, m_n)$ in which each member $m_i$ is typically smaller and faster than the next highest member $m_{i+1}$ of the hierarchy. To limit waiting by higher levels, a lower level of a hierarchical memory structure may respond by filling a buffer and then signaling for activating the transfer. For example, in some embodiments, the hierarchical memory implemented in the memory 2504 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory 2504 may be arranged.

The processing device 2500 may include a communication device 2506, which may be implemented substantially as described above with reference to the communication chip 1606 (FIG. 16). In some embodiments, the communication device 2506 may be a designated device configured to provide communication functionality for the components of the processing device 2500 (i.e., local), while the communication chip 1606 may be configured to provide system-level communication functionality for the entire computing device 1600 (i.e., global).

The processing device 2500 may include interconnects 2508, which may include any element or device that includes an electrically conductive material for providing electrical connectivity to one or more components of, or associated with, a processing device 2500 or/and between various such components. Examples of the interconnects 2508 include conductive lines/wires (also sometimes referred to as "lines" or "metal lines" or "trenches") and conductive vias (also sometimes referred to as "vias" or "metal vias"), metallization stacks, redistribution layers, metal-insulator-metal (MIM) structures, etc.

The processing device 2500 may include a temperature detection device 2510 which may be implemented substantially as described above with reference to the temperature detection device 1626 (FIG. 16) but configured to determine temperatures on a more local scale, i.e., of the processing device 2500 of components thereof. In some embodiments, the temperature detection device 2510 may be a designated device configured to provide temperature detection functionality for the components of the processing device 2500 (i.e., local), while the temperature detection device 1626 may be configured to provide system-level temperature detection functionality for the entire computing device 1600 (i.e., global).

The processing device 2500 may include a temperature regulation device 2512 which may be implemented substantially as described above with reference to the temperature regulation device 1628 (FIG. 16) but configured to regulate temperatures on a more local scale, i.e., of the processing device 2500 of components thereof. In some embodiments, the temperature regulation device 2512 may be a designated device configured to provide temperature regulation functionality for the components of the processing device 2500 (i.e., local), while the temperature regulation device 1628 may be configured to provide system-level temperature regulation functionality for the entire computing device 1600 (i.e., global).

The processing device 2500 may include a battery/power circuitry 2514 which may be implemented substantially as described above with reference to the battery/power circuitry 1610 (FIG. 16). In some embodiments, the battery/power circuitry 2514 may be a designated device configured to provide battery/power functionality for the components of the processing device 2500 (i.e., local), while the battery/power circuitry 1610 may be configured to provide system-level battery/power functionality for the entire computing device 1600 (i.e., global).

The processing device 2500 may include a hardware security device 2516 which may be implemented substantially as described above with reference to the security interface device 1624 (FIG. 16). In some embodiments, the hardware security device 2516 may be a physical computing device configured to safeguard and manage digital keys, perform encryption and decryption functions for digital signatures, authentication, and other cryptographic functions. In some embodiments, the hardware security device 2516 may include one or more secure cryptoprocessors chips.

Select Examples

Example 1 provides an IC device, including: a substrate; and a transistor, including a channel region over the substrate, where an angle between a first crystal direction of a semiconductor material in the substrate and a second crystal direction of a semiconductor material in the channel region is between 4 degrees and 60 degrees, and the first crystal direction and the second crystal direction have same Miller indices (e.g., [100], [010], [001], [110], [111], etc.).

Example 2 provides the IC device according to example 1, where the channel region has a longitudinal axis in a direction from a source region of the transistor to a drain region of the transistor, and the longitudinal axis is not perpendicular or parallel to an edge of the substrate.

Example 3 provides the IC device according to example 2, where an angle between the longitudinal axis of the channel region and the edge of the substrate is between 4 and 60 degrees.

Example 4 provides the IC device according to example 1, where: the transistor is a first transistor, the IC further includes a second transistor, a third crystal direction of a semiconductor material of a channel region of the second transistor is not in parallel with the second crystal direction, and the third crystal direction and the second crystal direction have same Miller indices.

Example 5 provides the IC device according to example 1, where the channel region is a fin extending away from the substrate.

Example 6 provides the IC device according to example 5, where: the fin includes a subfin, the subfin is between the channel region and the substrate, a third crystal direction of a semiconductor material in a portion of the subfin is aligned with the first crystal direction or the second crystal direction, and the IC device further includes a gate electrode of the transistor wraps around at least a portion of the channel region of the fin.

Example 7 provides the IC device according to example 6, where: the portion of the subfin is a first portion of the subfin, a fourth crystal direction of a semiconductor material in a second portion of the subfin is aligned with the second crystal direction, the first portion of the subfin is between the substrate and the second portion of the subfin, and the second portion of the subfin is between the channel region and the first portion of the subfin.

Example 8 provides the IC device according to example 1, where the channel region is a nanoribbon or a nanowire.

Example 9 provides an IC device, including: a first substrate, the first substrate having a crystal structure with a first crystal direction; a second substrate over the first substrate, the second substrate including a semiconductor material and having a crystal structure with a second crystal direction; and a semiconductor structure at least partially in the second substrate, the semiconductor structure including: a source region, a drain region, and a channel region between the source region and the drain region, where the channel region includes a crystal structure having a third crystal direction, where the third crystal direction is aligned with the second crystal direction and is not aligned with the first crystal direction.

Example 10. The IC device according to example 9, where an angle between the third crystal direction and the first crystal direction is in a range from 4 to 60 degrees.

Example 11. The IC device according to example 9, where an area of a surface of the second substrate is equal to or smaller than an area of a surface of the first substrate.

Example 12. The IC device according to example 9, where the semiconductor structure is a planar structure or a non-planar structure.

Example 13. The IC device according to example 1, further including a gate, where at least a portion of the channel region is wrapped around by the gate, and the gate is coupled to a control line of a memory device.

Example 14 provides a method for forming an IC device, the method including: providing a first wafer and a second wafer, the first wafer having a first surface, the second wafer having a second surface; bonding the first surface with the second surface in a way that there is a predetermined angle between an orientation of the first wafer and an orientation of the second wafer, where the orientation of the first wafer is parallel or perpendicular to another surface of the first wafer, and the orientation of the second wafer is parallel or perpendicular to another surface of the second wafer; and forming a semiconductor structure at least partially in the second wafer, the semiconductor structure including: a source region, a drain region, and a channel region between the source region and the drain region.

Example 15. The method according to example 14, further including: forming a gate around at least a portion of the channel region; coupling the gate with a WL of a memory cell; and coupling the source region with a BL of the memory cell.

Example 16. The method according to example 14, further including: before forming the semiconductor structure in the second wafer, reducing a thickness of the second wafer to a predetermined thickness.

Example 17. The method according to example 14, where providing the first wafer and the second wafer includes: forming the second wafer with a semiconductor material, where the source region includes the semiconductor material with dopants of a first type and the drain region includes the semiconductor material doped with dopants of a second type.

Example 18. The method according to example 17, where the first type is different from the second type.

Example 19. The method according to example 14, where the first wafer includes a first material, and the second wafer includes a second material that is different from the first material.

Example 20. The method according to example 14, where the predetermined angle is in a range from 4 to 60 degrees.

Example 21 provides an IC package, including the IC device according to any one of examples 1-13; and a further IC component, coupled to the IC device.

Example 22 provides the IC package according to example 21, where the further IC component includes one of a package substrate, an interposer, or a further IC die.

Example 23 provides the IC package according to example 21 or 22, where the IC device according to any one of examples 1-13 may include, or be a part of, at least one of a memory device, a computing device, a wearable device, a handheld electronic device, and a wireless communications device.

Example 24 provides an electronic device, including a carrier substrate; and one or more of the IC devices according to any one of examples 1-13 and the IC package according to any one of examples 21-23, coupled to the carrier substrate.

Example 25 provides the electronic device according to example 24, where the carrier substrate is a motherboard.

Example 26 provides the electronic device according to example 24, where the carrier substrate is a PCB.

Example 27 provides the electronic device according to any one of examples 24-26, where the electronic device is a wearable electronic device or handheld electronic device.

Example 28 provides the electronic device according to any one of examples 24-27, where the electronic device further includes one or more communication chips and an antenna.

Example 29 provides the electronic device according to any one of examples 24-28, where the electronic device is an RF transceiver.

Example 30 provides the electronic device according to any one of examples 24-28, where the electronic device is one of a switch, a power amplifier, a low-noise amplifier, a filter, a filter bank, a duplexer, an upconverter, or a downconverter of an RF communications device, e.g., of an RF transceiver.

Example 31 provides the electronic device according to any one of examples 24-30, where the electronic device is a computing device.

Example 32 provides the electronic device according to any one of examples 24-31, where the electronic device is included in a base station of a wireless communication system.

Example 33 provides the electronic device according to any one of examples 24-31, where the electronic device is included in a user equipment device of a wireless communication system.

Example 34 provides the method according to any one of examples 14-20, further including processes for forming the IC device according to any one of examples 1-13.

Example 35 provides the method according to any one of examples 14-20, further including processes for forming the IC package according to any one of the examples 21-23.

Example 36 provides the method according to any one of examples 14-20, further including processes for forming the electronic device according to any one of the examples 24-33.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
   a substrate; and
   a transistor, comprising a channel region over the substrate,
   wherein an angle between a first crystal direction of a semiconductor material in the substrate and a second crystal direction of a semiconductor material in the channel region is between 4 degrees and 60 degrees, and the first crystal direction and the second crystal direction have same Miller indices.

2. The IC device according to claim 1, wherein the channel region has a longitudinal axis in a direction from a source region of the transistor to a drain region of the transistor, and the longitudinal axis is not perpendicular or parallel to an edge of the substrate.

3. The IC device according to claim 2, wherein an angle between the longitudinal axis of the channel region and the edge of the substrate is between 4 and 60 degrees.

4. The IC device according to claim 1, wherein:
   the transistor is a first transistor,
   the IC further comprises a second transistor,
   a third crystal direction of a semiconductor material of a channel region of the second transistor is not in parallel with the second crystal direction, and
   the third crystal direction and the second crystal direction have same Miller indices.

5. The IC device according to claim 1, wherein the channel region is a fin extending away from the substrate.

6. The IC device according to claim 5, wherein:
   the fin includes a subfin,
   the subfin is between the channel region and the substrate,
   a third crystal direction of a semiconductor material in a portion of the subfin is aligned with the first crystal direction or the second crystal direction, and
   a gate electrode of the transistor wraps around at least a portion of the channel region of the fin.

7. The IC device according to claim 6, wherein:
   the portion of the subfin is a first portion of the subfin,
   a fourth crystal direction of a semiconductor material in a second portion of the subfin is aligned with the second crystal direction, the first portion of the subfin is between the substrate and the second portion of the subfin, and the second portion of the subfin is between the channel region and the first portion of the subfin.

8. The IC device according to claim 1, wherein the channel region is a nanoribbon or a nanowire.

9. The IC device according to claim 1, further comprising a gate, wherein at least a portion of the channel region is wrapped around by the gate, and the gate is coupled to a control line of a memory device.

10. An integrated circuit (IC) device, comprising:
a first substrate, the first substrate having a crystal structure with a first crystal direction;
a second substrate over the first substrate, the second substrate comprising a semiconductor material and having a crystal structure with a second crystal direction; and
a semiconductor structure at least partially in the second substrate, the semiconductor structure comprising:
a source region,
a drain region, and
a channel region between the source region and the drain region,
wherein the channel region includes a crystal structure having a third crystal direction, and the third crystal direction is aligned with the second crystal direction and is not aligned with the first crystal direction.

11. The IC device according to claim 10, wherein an angle between the third crystal direction and the first crystal direction is in a range from 4 to 60 degrees.

12. The IC device according to claim 10, wherein an area of a surface of the second substrate is equal to or smaller than an area of a surface of the first substrate.

13. The IC device according to claim 10, wherein the semiconductor structure is a planar structure or a non-planar structure.

14. A method for forming an integrated circuit (IC) device, the method comprising:
providing a first wafer and a second wafer, the first wafer having a first surface, the second wafer having a second surface;
bonding the first surface with the second surface in a way that there is a predetermined angle between an orientation of the first wafer and an orientation of the second wafer, wherein the orientation of the first wafer is parallel or perpendicular to another surface of the first wafer, and the orientation of the second wafer is parallel or perpendicular to another surface of the second wafer; and
forming a semiconductor structure at least partially in the second wafer, the semiconductor structure comprising:
a source region,
a drain region, and
a channel region between the source region and the drain region.

15. The method according to claim 14, further comprising:
forming a gate around at least a portion of the channel region;
coupling the gate with a wordline of a memory cell; and
coupling the source region with a bitline of the memory cell.

16. The method according to claim 14, further comprising:
before forming the semiconductor structure in the second wafer, reducing a thickness of the second wafer to a predetermined thickness.

17. The method according to claim 14, wherein providing the first wafer and the second wafer comprises:
forming the second wafer with a semiconductor material, wherein the source region includes the semiconductor material with dopants of a first type and the drain region includes the semiconductor material doped with dopants of a second type.

18. The method according to claim 17, wherein the first type is different from the second type.

19. The method according to claim 14, wherein the first wafer comprises a first material, and the second wafer comprises a second material that is different from the first material.

20. The method according to claim 14, wherein the predetermined angle is in a range from 4 to 60 degrees.

* * * * *